(12) United States Patent
Aketa et al.

(10) Patent No.: US 9,111,769 B2
(45) Date of Patent: Aug. 18, 2015

(54) SEMICONDUCTOR DEVICE AND METHOD FOR PRODUCING SAME

(75) Inventors: Masatoshi Aketa, Kyoto (JP); Yuta Yokotsuji, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/118,173

(22) PCT Filed: May 16, 2012

(86) PCT No.: PCT/JP2012/062532
§ 371 (c)(1),
(2), (4) Date: Jan. 8, 2014

(87) PCT Pub. No.: WO2012/157679
PCT Pub. Date: Nov. 22, 2012

(65) Prior Publication Data
US 2015/0034970 A1 Feb. 5, 2015

(30) Foreign Application Priority Data

May 18, 2011 (JP) .................................. 2011-111129
Jun. 22, 2011 (JP) .................................. 2011-138400

(51) Int. Cl.
H01L 27/095 (2006.01)
H01L 29/47 (2006.01)
H01L 29/812 (2006.01)
H01L 31/07 (2012.01)
H01L 31/108 (2006.01)
H01L 29/06 (2006.01)
H01L 29/16 (2006.01)
H01L 29/872 (2006.01)
H01L 21/04 (2006.01)
H01L 21/265 (2006.01)
H01L 29/20 (2006.01)
H01L 29/66 (2006.01)

(52) U.S. Cl.
CPC ............ *H01L 29/063* (2013.01); *H01L 21/046* (2013.01); *H01L 21/0415* (2013.01); *H01L 21/26546* (2013.01); *H01L 29/0611* (2013.01); *H01L 29/1608* (2013.01); *H01L 29/2003* (2013.01); *H01L 29/66143* (2013.01); *H01L 29/66212* (2013.01); *H01L 29/872* (2013.01)

(58) Field of Classification Search
CPC ................. H01L 27/0766; H01L 29/47; H01L 29/66143; H01L 29/66212; H01L 29/7806; H01L 29/782; H01L 29/872; H01L 31/108; H01L 31/1085; H01L 33/0033; H01L 51/0579; H01L 2924/12032
See application file for complete search history.

(56) References Cited

U.S. PATENT DOCUMENTS

2005/0077591 A1 4/2005 Fukuda et al.
2007/0235768 A1 10/2007 Nakazawa et al.
2009/0160008 A1* 6/2009 Fujiwara et al. .............. 257/471

FOREIGN PATENT DOCUMENTS

JP H01-257370 A 10/1989
JP 2000-036607 A 2/2000
(Continued)

*Primary Examiner* — Hoai V Pham
(74) *Attorney, Agent, or Firm* — Rabin & Berdo, P.C.

(57) ABSTRACT

A semiconductor device of the present invention includes a semiconductor layer made of a wide bandgap semiconductor and a Schottky electrode being in contact with a surface of the semiconductor layer. The semiconductor layer includes a drift layer that forms the surface of the semiconductor layer and a high-resistance layer that is formed on a surface layer portion of the drift layer and that has higher resistance than the drift layer. The high-resistance layer is formed by implanting impurity ions from the surface of the semiconductor layer and then undergoing annealing treatment at less than 1500° C.

21 Claims, 18 Drawing Sheets

(56) References Cited

FOREIGN PATENT DOCUMENTS

| | | |
|---|---|---|
| JP | 2000-188406 A | 7/2000 |
| JP | 2002-217116 A | 8/2002 |
| JP | 2003-115472 A | 4/2003 |
| JP | 2005-079339 A | 3/2005 |
| JP | 2006-261563 A | 9/2006 |
| JP | 2007-305609 A | 11/2007 |
| JP | 2007-324218 A | 12/2007 |
| JP | 2012-049347 A | 3/2012 |

* cited by examiner

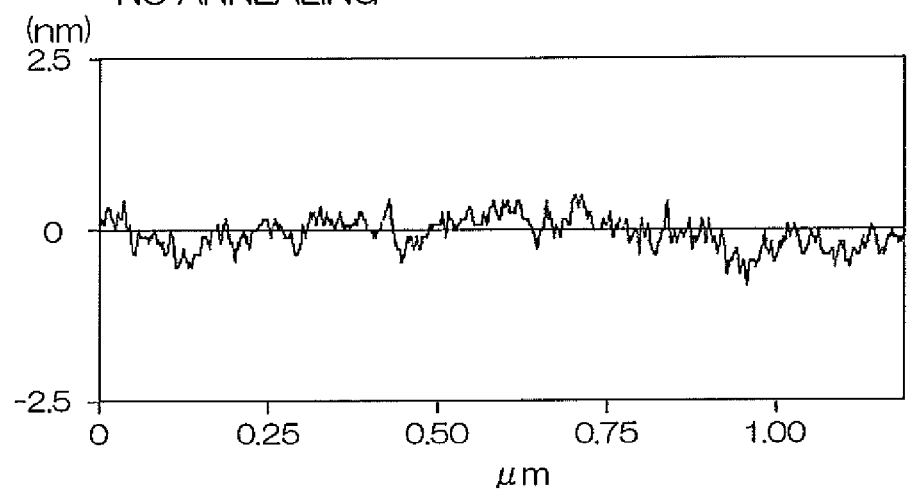
FIG. 11 NO ANNEALING
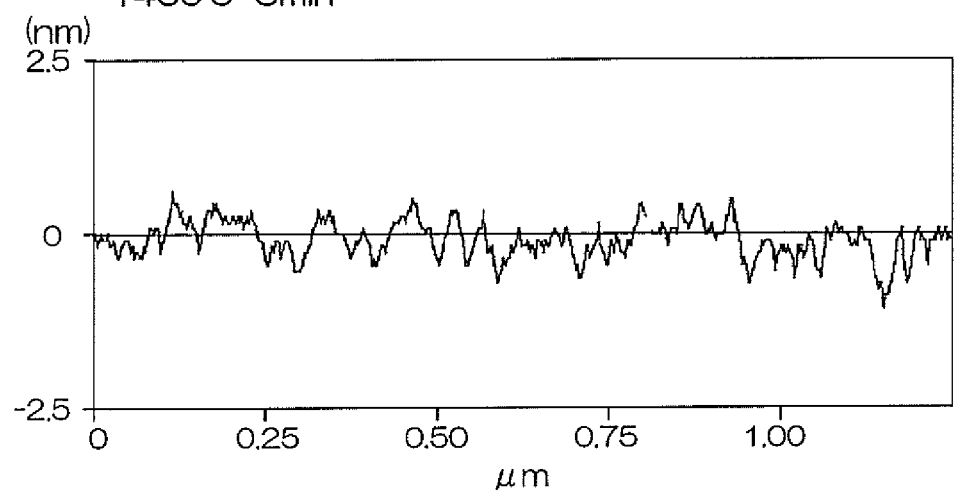
FIG. 12 1450°C 3min
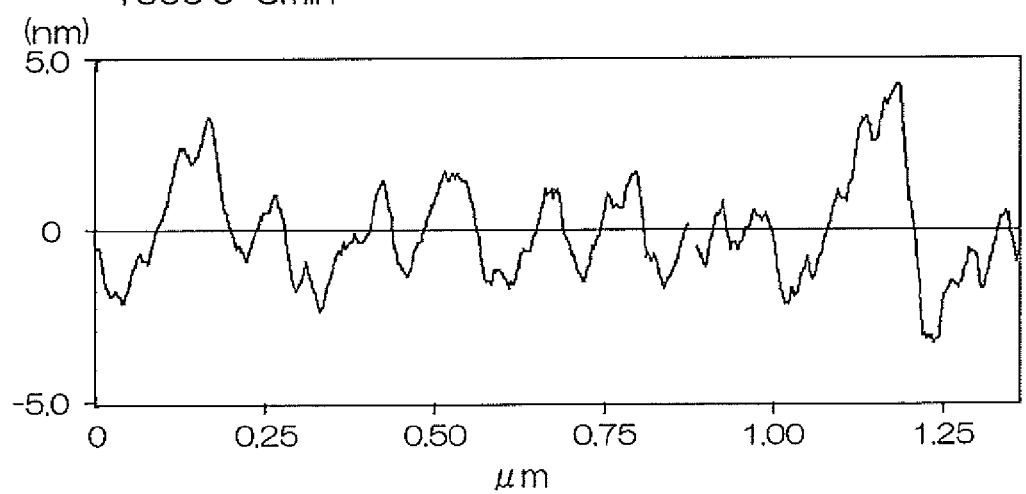
FIG. 13 1600°C 3min

HIGH-RESISTANCE LAYER PRESENT

FIG. 19
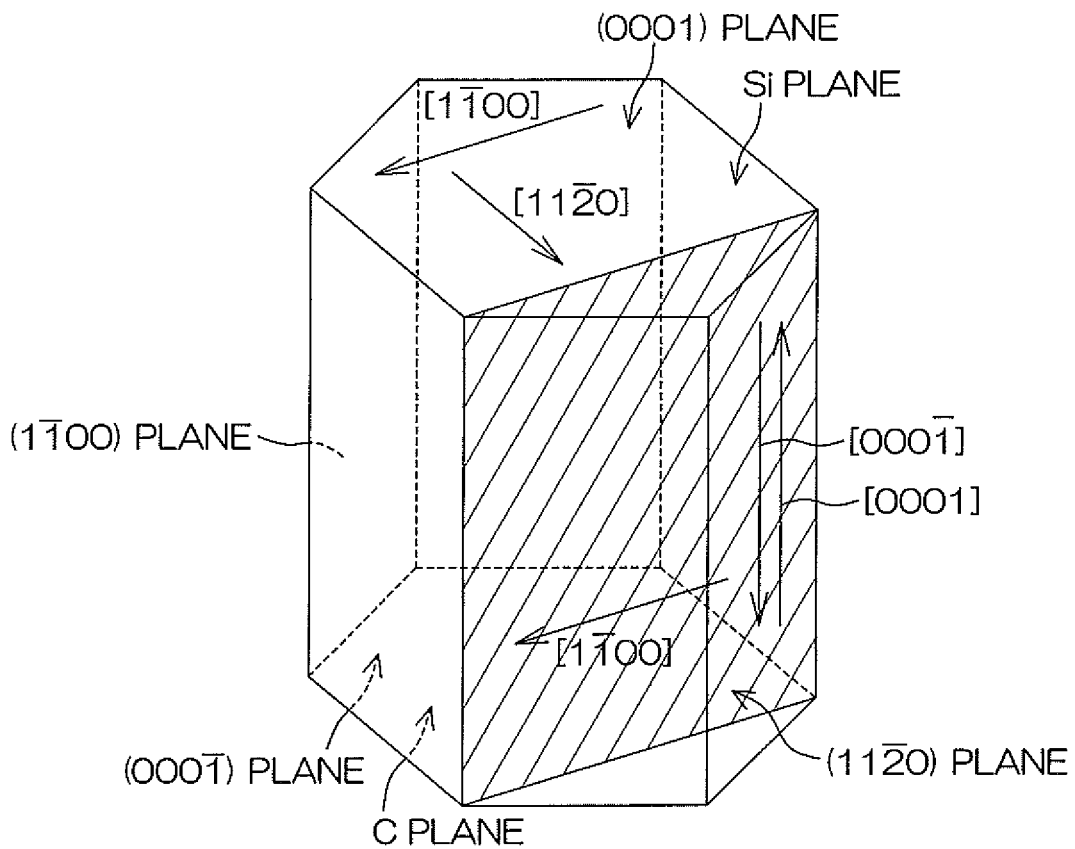
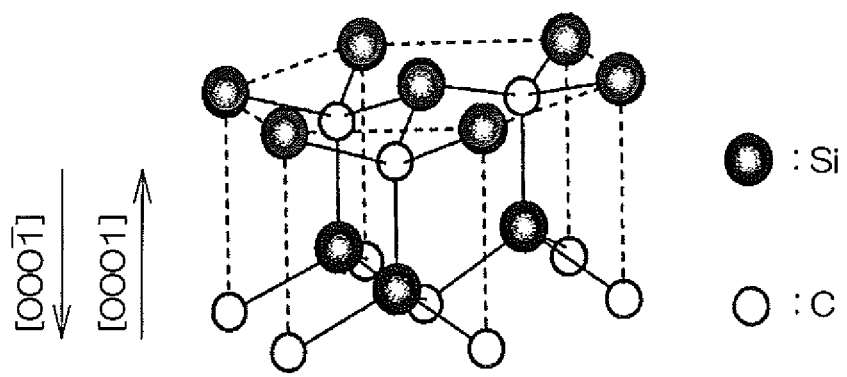

SEMICONDUCTOR DEVICE AND METHOD FOR PRODUCING SAME

TECHNICAL FIELD

The present invention relates to a semiconductor device that includes a Schottky barrier diode made of a wide bandgap semiconductor, and relates to a method for producing the semiconductor device.

BACKGROUND ART

Attention has been heretofore paid to a semiconductor device (semiconductor power device) for use in systems, such as a motor control system or a power conversion system, chiefly in the field of various power electronics.

For example, Patent Literature 1 (PTL 1) discloses a Schottky barrier diode in which SiC is employed. The Schottky barrier diode of Patent Literature 1 includes an n type 4H—SiC bulk substrate in which a (000-1) plane is defined as a principal plane, an n type epitaxial layer that has grown into a principal plane of the bulk substrate, an oxide film that is formed on a surface ((000-1) plane) of the epitaxial layer and by which the surface of the epitaxial layer is partially exposed, and a Schottky electrode that is formed inside an opening of the oxide film and that makes a Schottky junction with the epitaxial layer.

CITATION LIST

Patent Literature

PTL 1: Japanese Unexamined Patent Publication No. 2005-79339

SUMMARY OF INVENTION

Solution to Problem

The semiconductor device of the present invention includes a semiconductor layer made of a wide bandgap semiconductor and a Schottky electrode being in contact with a front surface of the semiconductor layer, and the semiconductor layer includes a drift layer that forms the front surface of the semiconductor layer and a high-resistance layer that is formed on a surface layer portion of the drift layer and that has resistance higher than the drift layer, and the high-resistance layer is formed by implanting impurity ions from the front surface of the semiconductor layer and then performing annealing treatment at less than 1500° C.

The wide bandgap semiconductor has an extremely higher breakdown voltage than silicon. This performance makes it possible to allow the semiconductor device using a wide bandgap semiconductor to fulfill high pressure resistance. This stems from the fact that the wide bandgap semiconductor has extremely higher insulation breakdown electric field strength than silicon. Therefore, a device having a comparatively high reverse voltage can be designed by using a Schottky barrier diode structure.

However, when a high reverse voltage is applied to the Schottky barrier diode, a high electric field is exerted on the wide bandgap semiconductor even if the diode does not break down. Therefore, if the height (barrier height) of a Schottky barrier between the Schottky electrode and the wide bandgap semiconductor is lowered in order to reduce the forward voltage of the Schottky barrier diode, a leakage current (reverse leakage current) that flows beyond the Schottky barrier when a reverse voltage is applied will increase resulting from high electric field strength in the wide bandgap semiconductor.

From the viewpoint of prevention of an increase in the reverse leakage current, the Schottky barrier diode using a wide bandgap semiconductor is required not to receive the application of a high reverse voltage, and is required to raising the barrier height to some extent. As a result, there is a problem that the pressure resistance of the wide bandgap semiconductor capable of preventing a breakdown against a high reverse voltage cannot be used extremely efficiently.

Here, the present inventors examined the distribution of electric field strength when a reverse voltage was applied. First, when a reverse voltage is applied to a semiconductor layer made of a wide bandgap semiconductor that does not have a high-resistance layer, the electric field strength becomes higher in proportion to an approach to the front surface of the semiconductor layer from the rear surface thereof in most cases. This electric field strength reaches the maximum at the front surface of the semiconductor layer.

The electric field strength in the front surface of the semiconductor layer is high in a Schottky barrier diode in which a Schottky electrode is allowed to make a Schottky junction with the front surface of the semiconductor layer arranged as above and in which the height (barrier height) of a Schottky barrier between the Schottky electrode and the semiconductor layer is lowered. It is difficult to reduce a reverse leakage current flowing beyond this Schottky barrier when a reverse voltage close to a breakdown voltage is applied.

Therefore, according to the present invention, a high-resistance layer is formed on the surface layer portion of a semiconductor layer (drift layer). This makes it possible to weaken electric field strength in the front surface of the semiconductor layer. The electric field strength in the front surface of the semiconductor layer is weak during an application of a reverse voltage, and therefore it is possible to reduce a reverse leakage current even if the barrier height between the Schottky electrode being in contact with the front surface of the semiconductor layer and the semiconductor layer is lowered. In other words, it is possible to reliably reduce a reverse leakage current even if a reverse voltage close to a breakdown voltage is applied, and therefore it is possible to satisfactorily utilize the pressure resistance of the wide bandgap semiconductor. Additionally, the barrier height can be lowered, and therefore it is possible to reduce a forward voltage.

Additionally, a high-resistance layer is formed by implanting impurity ions from the front surface of the semiconductor layer and then performing annealing treatment at less than 1500° C.I It is possible to reduce the amount of sublimation of the wide bandgap semiconductor during annealing treatment. As a result, the occurrence of step bunching in the front surface of the semiconductor layer can be restrained, and therefore it is possible to excellently maintain the flatness of the front surface of the semiconductor layer.

The annealing treatment at less than 1500° C. denotes annealing treatment performed in such a degree as not to activate implanted impurity ions although a defect generated by the collision of the implanted impurity ions in the crystal structure of the wide bandgap semiconductor is recovered (crystallinity recovery).

Additionally, the Schottky electrode in the present invention is a concept including both a metal electrode forming a Schottky barrier between the metal electrode and the semiconductor layer and a semiconductor electrode that is made of a hetero-semiconductor having a bandgap differing from the bandgap of the semiconductor layer and that makes a hetero-junction (junction to create a potential barrier between the semiconductor layer and the electrode by using a bandgap difference) with the semiconductor layer. Hereinafter, in this specification division, the Schottky junction and the heterojunction are generically referred to as "Schottky junction," and the Schottky barrier and the potential barrier (hetero barrier) formed by a heterojunction are generically referred to as "Schottky barrier," and the metal electrode and the semiconductor electrode are generically referred to as "Schottky electrode."

Preferably, the semiconductor device of the present invention is obtained by applying a voltage greater than a reverse breakdown voltage between the semiconductor layer and the Schottky electrode after applying annealing treatment to the high-resistance layer.

This makes it possible to make the reverse leakage current even smaller.

Preferably, in the semiconductor device of the present invention, the semiconductor layer is made of SiC, and has the front surface consisting of a Si plane, and pits that match a dislocation defect are not formed on the front surface consisting of the Si plane of the semiconductor layer.

Preferably, in the semiconductor device of the present invention, the surface roughness Rms of a junction interface of the front surface of the semiconductor layer making a junction with the Schottky electrode is 1 nm or less.

Preferably, in the semiconductor device of the present invention, an off-angle of the semiconductor layer is 4° or less.

Preferably, in the semiconductor device of the present invention, an activation rate of impurities of the high-resistance layer is less than 5%, and, preferably, the sheet resistance of the high-resistance layer is 1 M$\Omega$/□ or more.

Preferably, in the semiconductor device of the present invention, when the drift layer has a first part of a first conductivity type on which a first electric field is exerted when a reverse voltage is applied and a second part of the first conductivity type on which a second electric field relatively higher than the first electric field is exerted, the Schottky electrode includes a first electrode that forms a first Schottky barrier between the first part and the first electrode and a second electrode that forms a second Schottky barrier relatively higher than the first Schottky barrier between the second part and the second electrode.

In the present invention, there is a case in which a part having relatively high electric field strength and a part having relatively low electric field strength are present in the drift layer as in the relationship between the first part and the second part although the electric field concentration in the semiconductor layer can be restrained by the high-resistance layer.

Therefore, if the Schottky electrode is properly selected in accordance with the electric field distribution of the semiconductor layer when a reverse voltage is applied as above, a reverse leakage current can be restrained from flowing beyond the barrier by the second Schottky barrier that is comparatively high in the second part on which the second electric field that is relatively high is exerted when a reverse voltage is applied. On the other hand, in the first part on which the first electric field relatively low is exerted, the fear that the reverse leakage current will exceed the Schottky barrier is slight even if the height of the Schottky barrier is lowered. Therefore, during the application of a forward voltage, it is possible to preferentially pass an electric current at a low voltage by providing the first Schottky barrier that is comparatively low. Therefore, this arrangement makes it possible to efficiently reduce the reverse leakage current and the forward voltage.

Preferably, the first part of the drift layer is formed at, for example, a peripheral edge of the high-resistance layer in the surface layer portion of the drift layer, whereas the second part of the drift layer is formed at, for example, a part adjacent to the peripheral edge in the surface layer portion of the drift layer.

Preferably, in the semiconductor device of the present invention, when the drift layer includes a base drift layer having a first impurity concentration and a low-resistance drift layer that is formed on the base drift layer and that has a second impurity concentration relatively higher than the first impurity concentration, the high-resistance layer is formed so as to allow its deepest part to be positioned at a halfway place of the low-resistance drift layer, and divides a part of the semiconductor layer as a unit cell.

In the unit cell divided by the high-resistance layer, an area (current path) in which an electric current can be passed is limited. Therefore, there is a fear that the resistance value of the unit cell will be raised if the impurity concentration of a part that forms the unit cell in the semiconductor layer is low. Therefore, the high-resistance layer is formed so as to allow its deepest part to be positioned at a halfway place of the low-resistance drift layer as mentioned above, and, as a result, all of or part of the unit cell can be formed of the low-resistance drift layer. Therefore, in a part in which the low-resistance drift layer is formed, the resistance value can be restrained from rising by the low-resistance drift layer having the second impurity concentration that is comparatively high even if the current path is narrowed. As a result, the resistance of the unit cell can be lowered.

The first impurity concentration of the base drift layer may become smaller in proportion to an approach to the front surface from a rear surface of the semiconductor layer. The second impurity concentration of the low-resistance drift layer may be constant from the rear surface of the semiconductor layer to the front surface, or may become smaller in proportion to an approach to the front surface from the rear surface of the semiconductor layer.

Preferably, the drift layer further includes a surface drift layer that is formed on the low-resistance drift layer and that has a third impurity concentration relatively lower than the second impurity concentration.

This arrangement makes it possible to reduce the impurity concentration of the surface layer portion of the semiconductor layer, and therefore it is possible to reduce electric field strength exerted on the surface layer portion of the semiconductor layer when a reverse voltage is applied. As a result, the reverse leakage current can be made even smaller.

The semiconductor layer may further include a SiC substrate and a buffer layer that is formed on the SiC substrate and that has a fourth impurity concentration relatively higher than the first impurity concentration.

The high-resistance layer may include a stripe layer formed in a striped shape, and may include a latticed layer formed in a latticed shape.

The drift layer and the high-resistance layer may show mutually different conductivity types, and may show mutually identical conductivity types. Any one of the combinations (drift layer: n type, high-resistance layer: p type), (drift layer: p type, high-resistance layer: n type), (both the drift layer and the high-resistance layer: n type), and (both the drift layer and the high-resistance layer: p type) may be employed as a concrete combination.

Preferably, the impurity ions implanted into the semiconductor layer in order to form the high-resistance layer include boron ions.

The boron ion is a comparatively light ion, and hence can be easily implanted from the front surface of the semiconductor layer to a deep position. Therefore, it is possible to easily control the depth of the high-resistance layer within a wide range from a shallow position to a deep position with respect to the front surface of the semiconductor layer.

The wide bandgap semiconductor (whose bandgap is 2 eV or more) is, for example, a semiconductor whose insulation breakdown electric field is greater than 1 MV/cm, and, more specifically, is SiC (e.g., the 4H—SiC insulation breakdown electric field is about 2.8 MV/cm and the bandgap width is about 3.26 eV), GaN (whose insulation breakdown electric field is about 3 MV/cm and whose bandgap width is about 3.42 eV), diamond (whose insulation breakdown electric field is about 8 MV/cm and whose bandgap width is about 5.47 eV), and so on.

A method for producing a semiconductor device of the present invention includes a step of forming a semiconductor layer that is made of a wide bandgap semiconductor and that includes a drift layer forming a front surface thereof, a step of forming a highly-concentrated impurity layer at a surface layer portion of the drift layer by selectively implanting impurity ions from the front surface of the semiconductor layer to the drift layer, a step of converting the highly-concentrated impurity layer into a high-resistance layer having higher resistance than the drift layer by applying annealing treatment onto the semiconductor layer at less than 1500° C., and a step of forming a Schottky electrode so as to come into contact with the front surface of the semiconductor layer.

According to this method, it is possible to produce the semiconductor device of the present invention. In other words, according to the semiconductor device produced according to this method, it is possible to lower a barrier height while reducing a reverse leakage current and to reduce a forward voltage. It is also possible to excellently maintain the flatness of the front surface of the semiconductor layer.

Preferably, the method for producing a semiconductor device of the present invention further includes a step of applying a voltage greater than a reverse breakdown voltage between the semiconductor layer and the Schottky electrode.

Preferably, when the step of forming the semiconductor layer is a step of forming a semiconductor layer that is made of SiC and that has the front surface consisting of a Si plane, the method for producing a semiconductor device of the present invention further includes a step of applying first cleaning treatment onto the front surface on which the highly-concentrated impurity layer has been formed by exposing the front surface of the semiconductor layer to $O_2$ plasma.

In the semiconductor device obtained according to the semiconductor-device producing method of the present invention, the front surface of the semiconductor layer is damaged when impurity ions are implanted to form a high-resistance layer. Therefore, after ion implantation, there is a need to perform cleaning treatment by which the damaged surface is improved and smoothed. In general, cleaning treatment is performed by forming a sacrificial oxide film while thermally oxidizing the front surface of the semiconductor layer and by peeling off the sacrificial oxide film.

However, if the device surface to which the Schottky electrode is bonded is a Si plane, oxidization first starts from a position that matches the threading dislocation (dislocation defect) that has propagated through the semiconductor layer in the thickness direction in the semiconductor layer, and the anisotropy of the oxidation rate exists in which the thermal oxidation rate of that part is faster than other parts. As a result, in the front surface (Si plane) of the semiconductor layer from which the sacrificial oxide film has peeled off, pits (small hollows) are formed at a position that matches a dislocation defect, and therefore a problem resides in the fact that the front surface of the semiconductor layer cannot be flattened. Additionally, a difference in the oxidation rate lies between an area (area in which a high-resistance layer is formed) into which impurity ions have been implanted and another area other than the aforementioned area resulting from a difference in the impurity concentration therebetween, and therefore another problem resides in the fact that a stepped part is generated between these areas after thermal oxidation.

Therefore, according to the method of one preferred embodiment of the present invention, the first cleaning treatment after the implantation of impurity ions is performed by radiating $O_2$ plasma. Therefore, in the front surface of the semiconductor layer that has undergone the first cleaning treatment, pits that match the dislocation defect can be prevented from being generated. Additionally, a stepped part can be prevented from being generated in the front surface of the semiconductor layer between the drift layer and the high-resistance layer. As a result, the flatness of the front surface of the semiconductor layer can be maintained excellently, and therefore it is possible to improve the bondability between the semiconductor layer and the Schottky electrode.

Preferably, the method for producing a semiconductor device of the present invention further includes a step of forming a field insulation film on the front surface of the semiconductor layer, a step of forming a contact hole that exposes the front surface of the semiconductor layer in the field insulation film by performing etching, and a step of applying second cleaning treatment onto the front surface of the semiconductor layer exposed to the contact hole by exposing the front surface of the semiconductor layer to $O_2$ plasma, in which the step of forming the Schottky electrode includes a step of forming the Schottky electrode so as to be exposed to the contact hole and so as to come into contact with the front surface of the semiconductor layer that has undergone the second cleaning treatment.

According to this method, the front surface of the semiconductor layer that has been damaged by etching is subjected to the second cleaning treatment by radiating $O_2$ plasma, and therefore, in the front surface of the semiconductor layer that has undergone the second cleaning treatment, pits that match the dislocation defect can be prevented from being generated. Additionally, a stepped part can be prevented from being generated in the front surface of the semiconductor layer between the drift layer and the high-resistance layer.

Preferably, in the semiconductor-device producing method of the present invention, the step of forming the highly-concentrated impurity layer includes a step of implanting the impurity ions into the drift layer at a dose amount of $1\times10^{14}$ $cm^{-2}$ or more.

According to this method, it is possible to make the pressure resistance of the semiconductor device even higher.

Additionally, the step of forming the highly-concentrated impurity layer may include a multistage implantation step of implanting the impurity ions from the front surface of the semiconductor layer to a predetermined depth through a plurality of stages by changing implanting energy, and may include a one-stage implantation step of implanting the impurity ions from the front surface of the semiconductor layer to a position of a predetermined depth.

BRIEF DESCRIPTION OF DRAWINGS

FIG. 11 is a cross-sectional profile of a surface of an epitaxial layer that has not undergone annealing treatment.

FIG. 12 is a cross-sectional profile of a surface of an epitaxial layer that has undergone annealing treatment at 1450° C.

FIG. 13 is a cross-sectional profile of a surface of an epitaxial layer that has undergone annealing treatment at 1600° C.

FIG. 19 is a schematic view showing a unit cell having a 4H—SiC crystal structure.

DESCRIPTION OF EMBODIMENTS

Preferred embodiments of the present invention will be hereinafter described in detail with reference to the accompanying drawings.

<Entire Structure of Schottky Barrier Diode>

Figure 1:
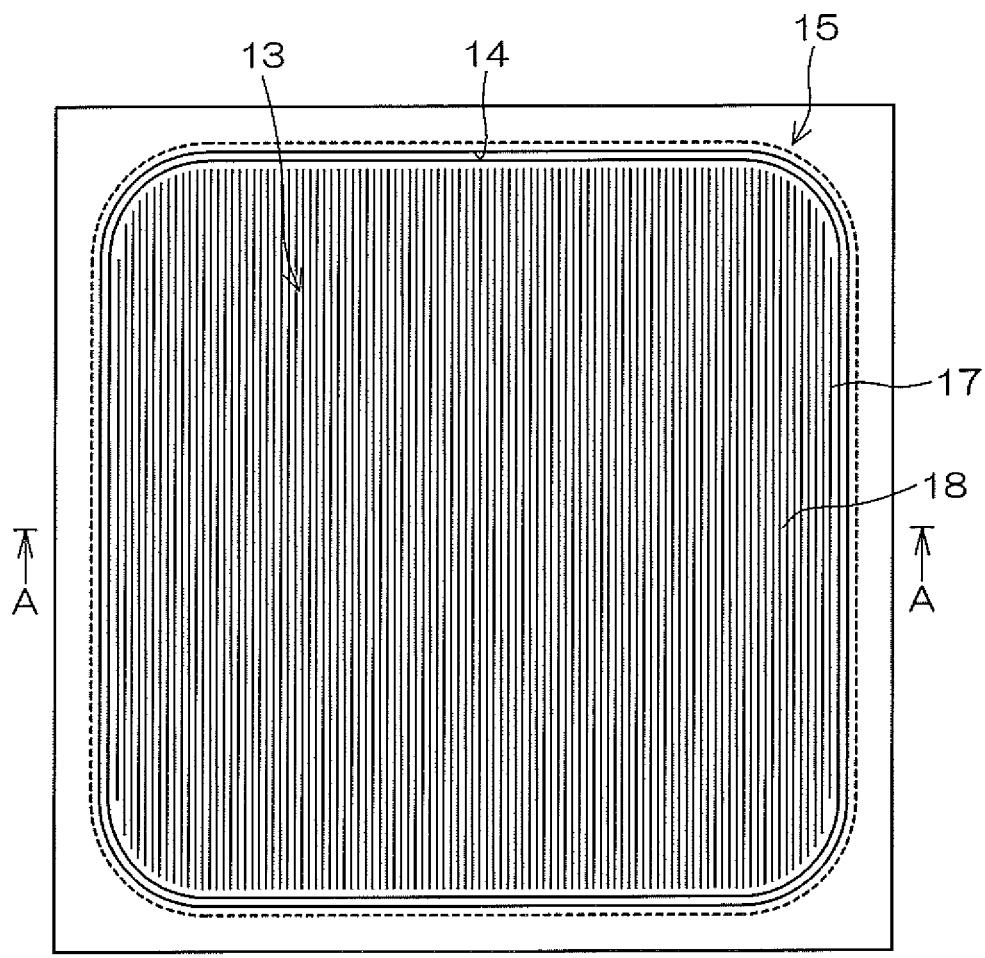
FIG. 1 is a plan view of a Schottky barrier diode according to a preferred embodiment of the present invention.
Figure 2:
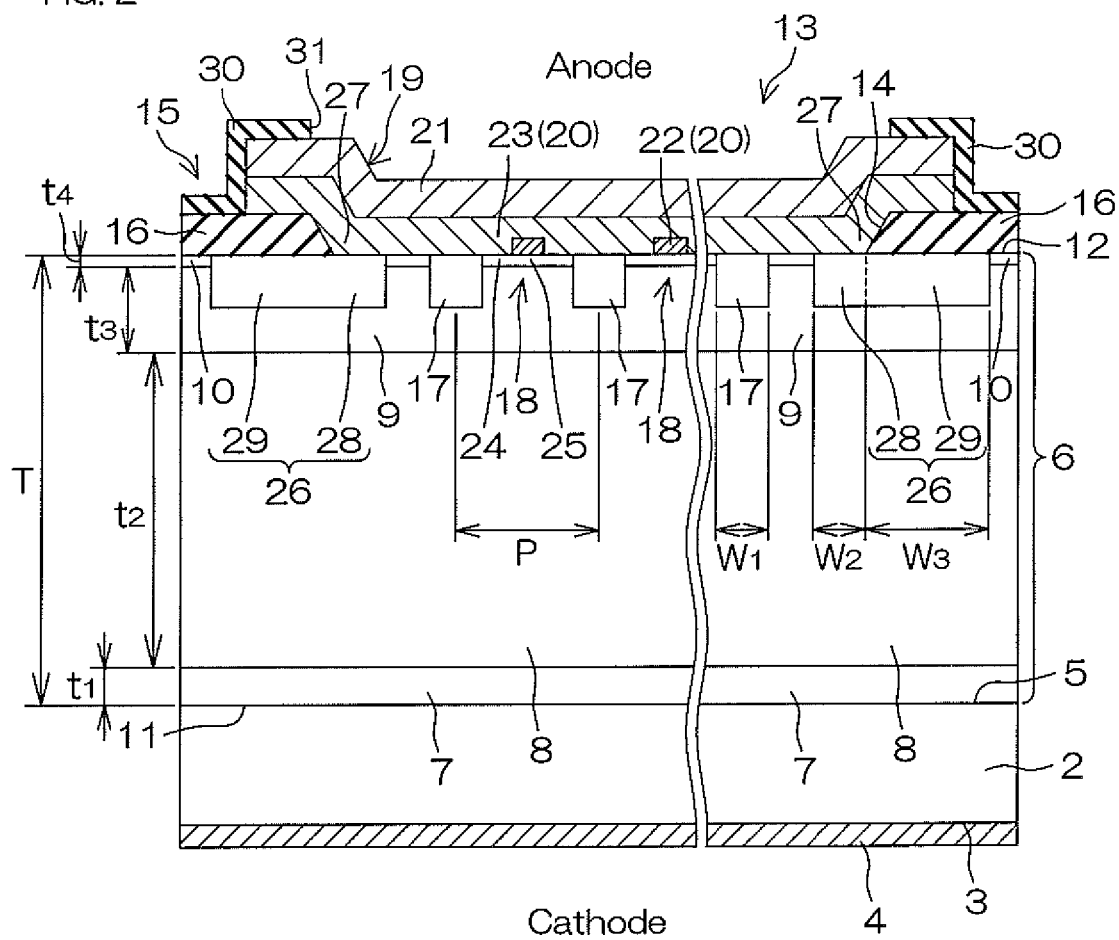
FIG. 2 is a sectional view seen from cross-section line A-A of FIG. 1.

FIG. 1 is a plan view of a Schottky barrier diode according to a preferred embodiment of the present invention. FIG. 2 is a sectional view seen from cross-section line A-A of FIG. 1.

The Schottky barrier diode 1 used as a semiconductor device is a Schottky barrier diode in which 4H—SiC is employed. 4H—SiC is a wide bandgap semiconductor that has an insulation breakdown electric field of about 2.8 MV/cm and that has a bandgap width of about 3.26 eV. The Schottky barrier diode 1 is formed in, for example, a square shape like a chip when viewed planarly, and is about several millimeters in length in each of the up, down, right, and left directions in the sheet of FIG. 1.

The Schottky barrier diode 1 includes a substrate (SiC substrate) 2 made of an $n^+$ type SiC that is one example of a semiconductor layer. The thickness of the substrate 2 is, for example, 50 μm to 600 μm. Preferably, the off-angle of the substrate 2 is 4° or less. For example, N (nitrogen), P (phosphorus), As (arsenic), etc., can be used as n type impurities.

A cathode electrode 4 serving as an ohmic electrode is formed on a rear surface ((000-1) C plane) 3 of the substrate 2 so as to cover its whole area. The cathode electrode 4 is made of metals (for example, Ti/Ni/Ag, Ti/Ni/Au/Ag) being in ohmic contact with n type SiC.

An epitaxial layer 6 made of n type SiC that is one example of a semiconductor layer is formed on a front surface ((0001) Si plane) 5 of the substrate 2. The front surface 5 of the substrate 2 may have a plane direction other than the Si plane ((0001) plane).

The epitaxial layer 6 has a structure formed in such a way that a buffer layer 7 and a drift layer having a three-layer structure are stacked up in this order from the front surface 5 of the substrate 2. The three-layer drift layer includes a base drift layer 8, a low-resistance drift layer 9, and a surface drift layer 10. The buffer layer 7 forms a rear surface ((000-1) C plane) 11 of the epitaxial layer 6, and is in contact with the front surface 5 of the substrate 2. On the other hand, the surface drift layer 10 forms a front surface ((0001) Si plane) 12 of the epitaxial layer 6.

The total thickness T of the epitaxial layer 6 is, for example, 3 μm to 100 μm. The thickness $t_1$ of the buffer layer 7 is, for example, 0.1 μm to 1 μm. The thickness $t_2$ of the base drift layer 8 is, for example, 2 μm to 100 μm. The thickness $t_3$ of the low-resistance drift layer 9 is, for example, 1 μm to 3 μm. The thickness $t_4$ of the surface drift layer 10 is, for example, 0.2 μm to 0.5 μm.

The front surface 12 of the epitaxial layer 6 is a flat surface whose surface roughness Rms is, for example, 1 nm or less, and, preferably, 0.1 nm to 0.5 nm. The surface roughness Rms (Root mean square) can be calculated, for example, based on actual measured values obtained by photographing the front surface 12 of the epitaxial layer 6 by use of an AFM (Atomic Force Microscope). In other words, the front surface 12 of the epitaxial layer 6 is a surface excellent in flatness that has the surface roughness Rms falling within the aforementioned range, and does not have pits that match the dislocation defect of the epitaxial layer 6 thereon.

Figure 3:
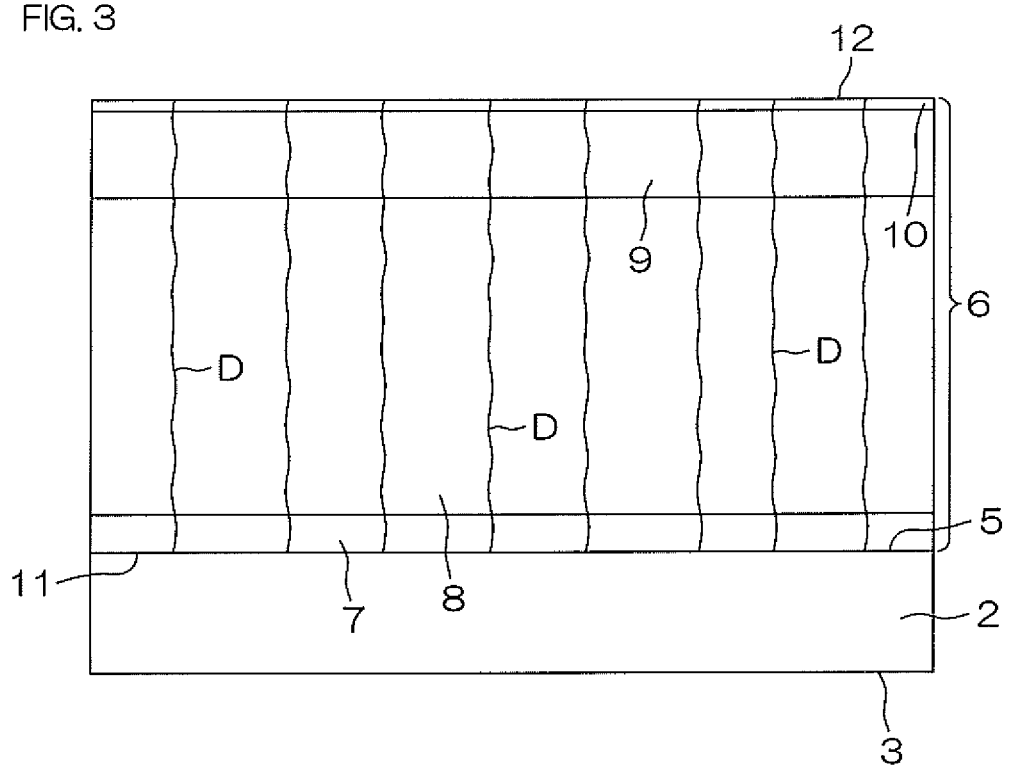
FIG. 3 is a view to describe a dislocation defect of an epitaxial layer.

The dislocation defect and pits of the epitaxial layer 6 will be described with reference to FIG. 3 and FIG. 4. As shown in FIG. 3, in the epitaxial layer 6, threading dislocation D (dislocation defect) propagating in the thickness direction from the rear surface 11 of the epitaxial layer 6 (the front surface 5 of the substrate 2) toward the front surface 12 of the epitaxial layer 6 is distributed resulting from, for example, the lattice mismatch or the difference in thermal expansion coefficient between the substrate 2 and the buffer layer 7. The density of the threading dislocation D is, for example, $1 \times 10^2$ to $5 \times 10^4$ cm$^{-2}$.

Figure 4:
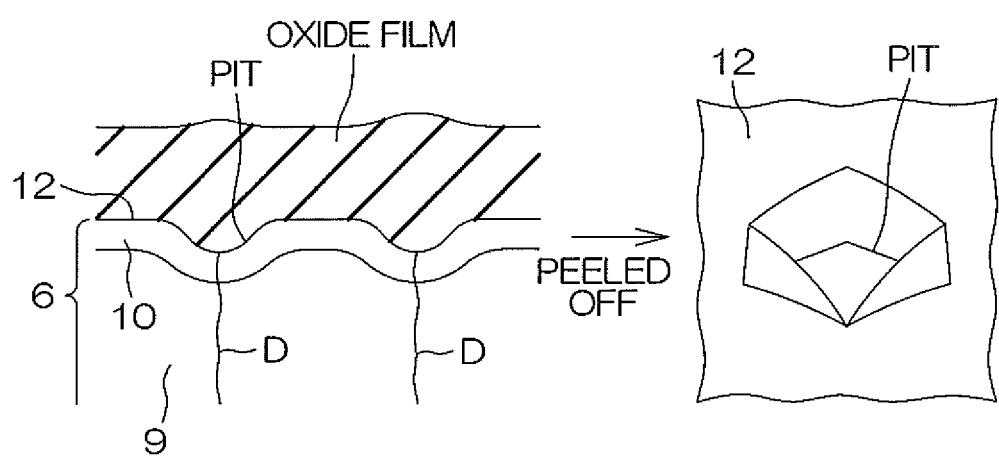
FIG. 4 is a view to describe a process in which pits are generated.

If the front surface 12 of the epitaxial layer 6 is a (0001) Si plane as in the present preferred embodiment, the front surface 12 first begins to be oxidized from a position that matches the threading dislocation D in the front surface 12 when an oxide film is formed by thermally oxidizing the front surface 12 as shown in FIG. 4, and the oxidation of this part progresses faster than other parts. In other words, the anisotropy of the oxidation rate exists. As a result, in the front surface 12 of the epitaxial layer 6 from which the oxide film has peeled off, the place matching the threading dislocation D locally becomes hollow, and pits are formed.

In the present preferred embodiment, as described later, the Schottky barrier diode 1 is produced without undergoing a process of thermally oxidizing the front surface 12 shown in FIG. 4. Therefore, pits that match the dislocation defect are not present on the front surface 12 of the epitaxial layer 6 of the Schottky barrier diode 1 obtained here.

Additionally, a field insulation film 16, which has a contact hole 14 by which a part of the epitaxial layer 6 is exposed as an active region 13 and which covers a field region 15 surrounding the active region 13, is formed on the front surface 12 of the epitaxial layer 6. The field insulation film 16 is made of, for example, SiO$_2$ (silicon oxide). The thickness of the field insulation film 16 is, for example, 0.5 μm to 3 μm.

A high-resistance layer 17 that passes through the surface drift layer 10 from the surface 12 and a deepest part of which is positioned at a halfway place of the low-resistance drift layer 9 is formed on the side of the front surface 12 of the epitaxial layer 6 in the active region 13. For example, the high-resistance layer 17 is formed like a stripe. The stripe-like high-resistance layer 17 is formed by arranging a plurality of high-resistance layers 17 that linearly extend along the mutually-facing direction of a couple of opposite sides of the Schottky barrier diode 1 in parallel with each other with an interval therebetween. The distance (pitch P of a unit cell 18) between centers of the adjoining high-resistance layers 17 is, for example, 2 μm to 20 μm. The depth $D_1$ of each high-resistance layer 17 (i.e., the distance from the front surface 12 of the epitaxial layer 6 to the deepest part of the high-resistance layer 17) is, for example, 1000 Å to 10000 Å. The width $W_1$ perpendicular to the longitudinal direction of each high-resistance layer 17 is 0.1 μm to 10 μm. For example, B (boron), Al (aluminum), Ar (argon), etc., can be used as impurities to form the high-resistance layer 17.

Accordingly, unit cells (line cells) 18 that are divided by being sandwiched between the adjoining high-resistance layers 17 are formed like a stripe in the epitaxial layer 6. Each unit cell 18 has a base portion that occupies most of its area and that is formed by the low-resistance drift layer 9, and has a surface layer portion that is placed on the side of the front surface 12 with respect to the base portion and that is formed by the surface drift layer 10.

The high-resistance layer 17 by which the unit cells 18 are divided is a layer that has higher resistance than the drift layers 8 to 10. For example, the sheet resistance of the high-resistance layer 17 is 1 MΩ/□ or more.

In the present preferred embodiment, the sheet resistance falling within the aforementioned range is achieved by setting the activation rate of impurities of the high-resistance layer 17, which are contained in a concentration of $1 \times 10^{17}$ cm$^{-3}$ to $5 \times 10^{20}$ cm$^{-3}$, for example, at less than 5%, and, preferably, at 0% to 0.1%. The activation rate of impurities denotes the rate of the number of activated impurity ions with respect to the total number of impurity ions implanted into the epitaxial layer 6 in a process for producing the Schottky barrier diode 1.

An anode electrode 19 is formed on the field insulation film 16. The anode electrode 19 has a two-layer structure consisting of a Schottky metal 20 that is one example of a Schottky electrode and a contact metal 21. The Schottky metal 20 is bonded to the epitaxial layer 6 inside the contact hole 14 of the field insulation film 16. The contact metal 21 is stacked on the Schottky metal 20.

The Schottky metal 20 includes a first metal 22 that is one example of a first electrode and a second metal 23 that is one example of a second electrode. The first metal 22 is formed on the surface of each unit cell 18. The second metal straddles the space between mutually adjoining high-resistance layers 17, and covers the first metal 22 on the surface of the unit cell 18 sandwiched between the high-resistance layers 17.

The first metal 22 is formed linearly along the longitudinal direction of the high-resistance layers 17 in a central portion 25 sandwiched between peripheral edges 24 of the adjoining high-resistance layers 17 in the surface of each unit cell 18.

The second metal 23 is formed so as to cover the whole of the active region 13, and is embedded in the contact hole 14 of the field insulation film 16. The second metal 23 is in contact with the peripheral edge 24 in the surface of each unit cell 18. The second metal 23 projects in a flange-like manner toward the outside of the contact hole 14 so as to cover the peripheral edge of the contact hole 14 in the field insulation film 16 from above. In other words, the peripheral edge of the field insulation film 16 is sandwiched between both of the upper and lower sides over its whole circumference by means of the epitaxial layer 6 (surface drift layer 10) and the second metal 23. Therefore, the outer peripheral area of the Schottky junction in the epitaxial layer 6 (i.e., the inner edge of the field region 15) is covered with the peripheral edge of the field insulation film 16 made of SiC.

The contact metal 21 is a part that is exposed to the topmost surface of the Schottky barrier diode 1 in the anode electrode 19 and to which a bonding wire or the like is bonded. The contact metal 21 is made of, for example, Al (aluminum). The contact metal 21 projects in a flange-like manner toward the outside of the contact hole 14 so as to cover the peripheral edge of the contact hole 14 in the field insulation film 16 from above in the same way as the Schottky metal 20 (the second metal 23).

A guard ring 26 is formed on the side of the front surface 12 of the epitaxial layer 6 in the field region 15. The guard ring 26 passes through the surface drift layer 10 from the front surface 12 of the epitaxial layer 6, and its deepest part is positioned at a halfway place of the low-resistance drift layer 9. The guard ring 26 is formed along the outline of the contact hole 14 so as to straddle the inside and the outside of the contact hole 14 of the field insulation film 16 (so as to straddle the active region 13 and the field region 15) when viewed planarly. Therefore, the guard ring 26 includes an inner part 28 that projects toward the inside of the contact hole 14 and an outer part 29 that projects toward the outside of the contact hole 14. The inner part 28 is in contact with an outer edge portion 27 that is a terminal of the anode electrode 19 (the second metal 23) in the contact hole 14. The outer part 29 faces the anode electrode 19 (the second metal 23) with the peripheral edge of the field insulation film 16 therebetween.

The width $W_2$ of the inner part 28 of the guard ring 26 is 20 μm to 80 μm, and the width $W_3$ of the outer part 29 of the guard ring 26 is 2 μm to 20 μm. For example, the depth $D_2$ from the front surface 12 of the epitaxial layer 6 of the guard ring 26 is the same (e.g., 1000 Å to 10000 Å) as that of the high-resistance layer 17.

The guard ring 26, like the high-resistance layer 17, is a layer that has higher resistance than each of the drift layers 8 to 10. In other words, in the guard ring 26, the sheet resistance is 1 MΩ/☐ or more, and the activation rate of impurities is less than 5% (preferably, 0% to 0.1%).

A surface protection film 30 made of, for example, silicon nitride (SiN) is formed on the topmost surface of the Schottky barrier diode 1. An opening 31 by which the anode electrode 19 (contact metal 21) is exposed is formed at a central part of the surface protection film 30. A bonding wire and the like are bonded to the contact metal 21 through the opening 31.

In the Schottky barrier diode 1, a forward bias state is reached by applying a positive voltage to the anode electrode 19 and by applying a negative voltage to the cathode electrode 4, and, as a result, electrons (carriers) are moved from the cathode electrode 4 to the anode electrode 19 through the active region 13 of the epitaxial layer 6, thus making it possible to pass an electric current therethrough.

<Introduction Effect of High-Resistance Layer>

With reference to FIG. 5 to FIG. 10, a description will be given of the effect of reducing a reverse leakage current and a forward voltage by forming the high-resistance layer 17 in the epitaxial layer 6.

(1) Analysis of Distribution of Electric Field Strength

Figure 5:
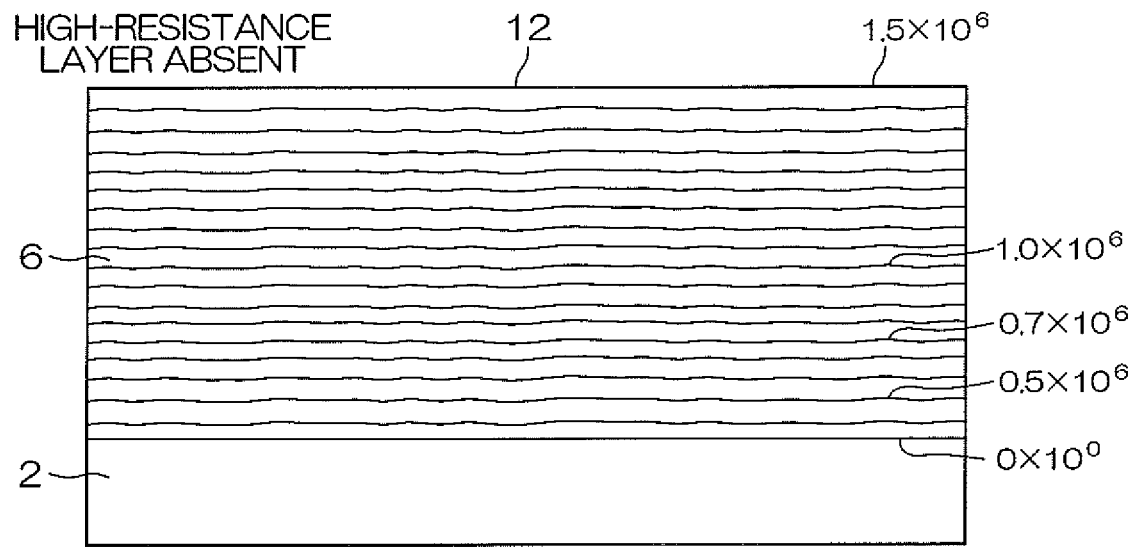
FIG. 5 is a distribution view (simulation data) of electric field strength when a high-resistance layer is absent.
Figure 6:
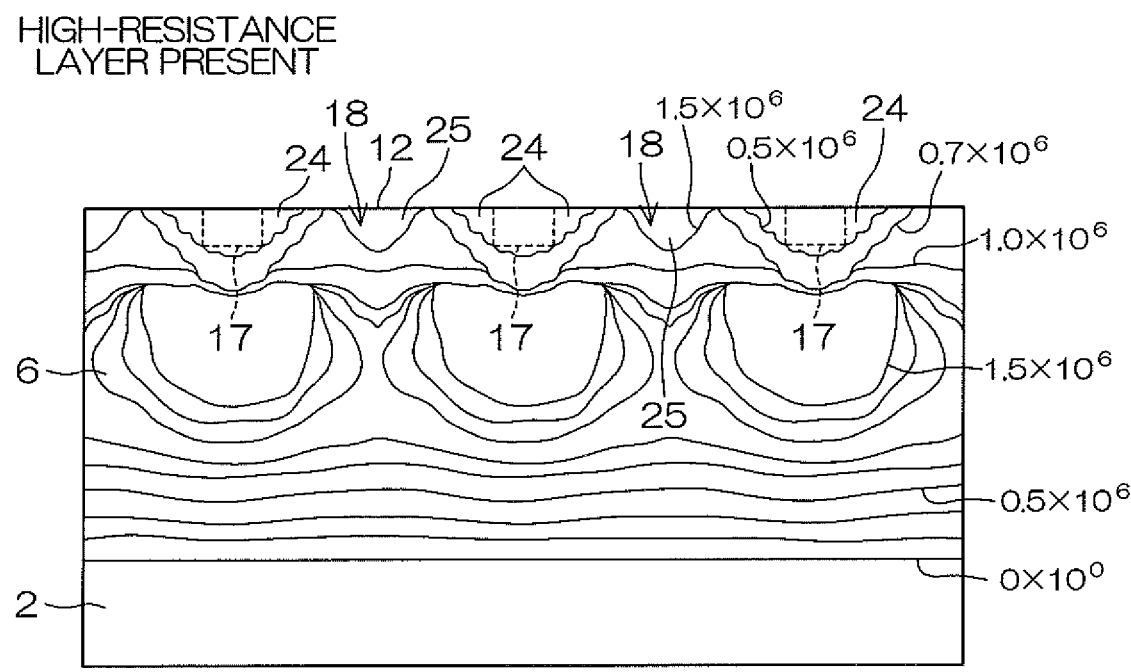
FIG. 6 is a distribution view (simulation data) of electric field strength when a high-resistance layer is present.

First, the distribution of electric field strength shown when a reverse voltage was applied to the epitaxial layer was analyzed by simulations. Results are shown in FIG. 5 and FIG. 6. In FIG. 5 and FIG. 6, the same reference sign as in FIG. 2 is given to each component equivalent to each component of FIG. 2.

The structure of FIG. 5 and that of FIG. 6 were designed as follows.

n+ type substrate 2: Concentration=$1 \times 10^{19}$ cm$^{-3}$, Thickness=1 μm n− type epitaxial layer 6: Concentration=$1 \times 10^{-16}$ cm$^{-3}$, Thickness T=5 μm High-resistance layer 17: Peak concentration=$1 \times 10^{20}$ cm$^{-3}$, Activation rate 1%, Depth $D_1$=3000 Å, Width $W_1$=1 μm Additionally, the distribution of electric field strength in the epitaxial layer 6 was simulated when a reverse voltage (600 V) was applied to the anode-to-cathode interval of the Schottky barrier diode 1 having the structure of FIG. 5 and that of FIG. 6. TCAD (product name) made by Synopsys Co. was used as a simulator.

In the Schottky barrier diode that does not have the high-resistance layer 17 as shown in FIG. 5, it has been recognized that the electric field strength becomes greater in proportion to an approach to the front surface 12 from the rear surface 11 of the epitaxial layer 6, and reaches the maximum (about $1.5 \times 10^6$ V/cm) at the front surface 12 of the epitaxial layer 6.

On the other hand, in the Schottky barrier diode that has the high-resistance layer 17 as shown in FIG. 6, it has been recognized that the electric field strength at the peripheral edge 24 of the part (unit cell 18) sandwiched between the mutually adjoining high-resistance layers 17 is weakened by the formation of the structure of the high-resistance layer 17. More specifically, the electric field strength of the peripheral edge 24 of the unit cell 18 was about $0.5 \times 10^6$ V/cm to $0.7 \times 10^6$ V/cm, and the electric field strength of the central part 25 of the unit cell 18 was about $1.5 \times 10^6$ V/cm. In other words, in the Schottky barrier diode of FIG. 6, the electric field strength at the peripheral edge 24 of the unit cell 18 shown when a reverse voltage close to a breakdown voltage is applied is weak even if the barrier height between the anode electrode 19 (Schottky metal 20) being in contact with the front surface 12 of the epitaxial layer 6 (front surface of the unit cell 18) and the epitaxial layer 6 is lowered. Therefore, it has been recognized that a reverse leakage current exceeding the barrier height can be reduced at least at the peripheral edge 24, and, as a result, the absolute amount of the reverse leakage current can be reduced.

From the foregoing fact, it has been recognized that, in the Schottky barrier diode 1 of FIG. 1 and FIG. 2, the barrier height can be lowered, and the forward voltage can be reduced while reducing the reverse leakage current.

(2) Analysis of Reverse Leakage Current

Figure 7:
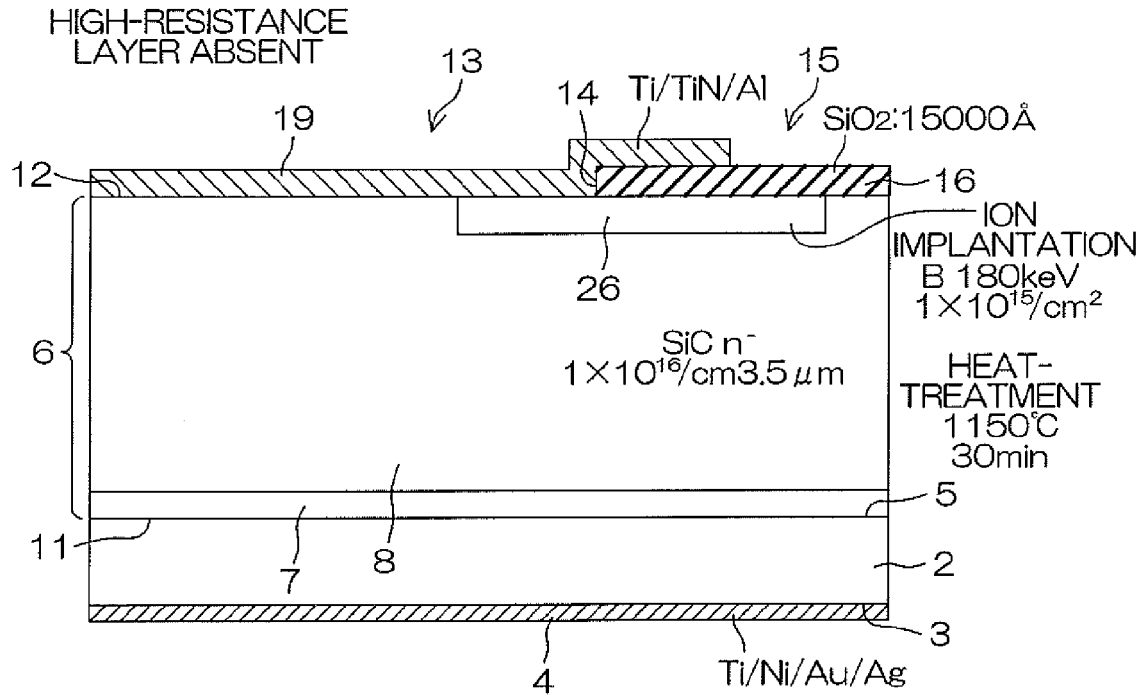
FIG. 7 is a sectional view of a prototype (high-resistance layer absent) of the Schottky barrier diode.
Figure 8:
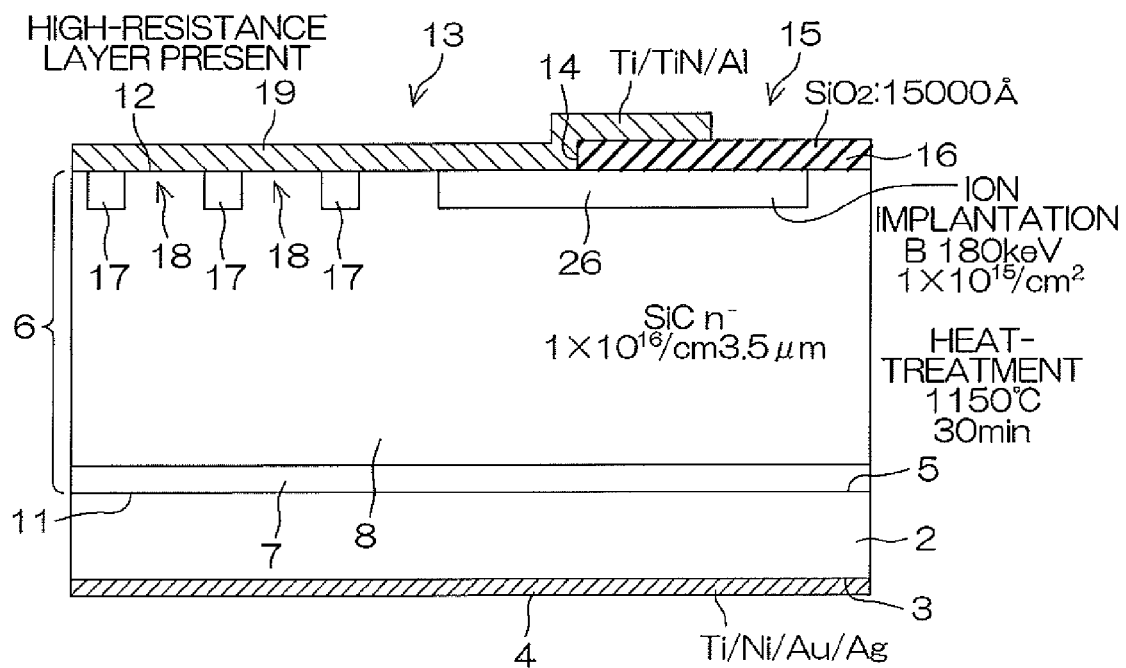
FIG. 8 is a sectional view of a prototype (high-resistance layer present) of the Schottky barrier diode.
Figure 9:
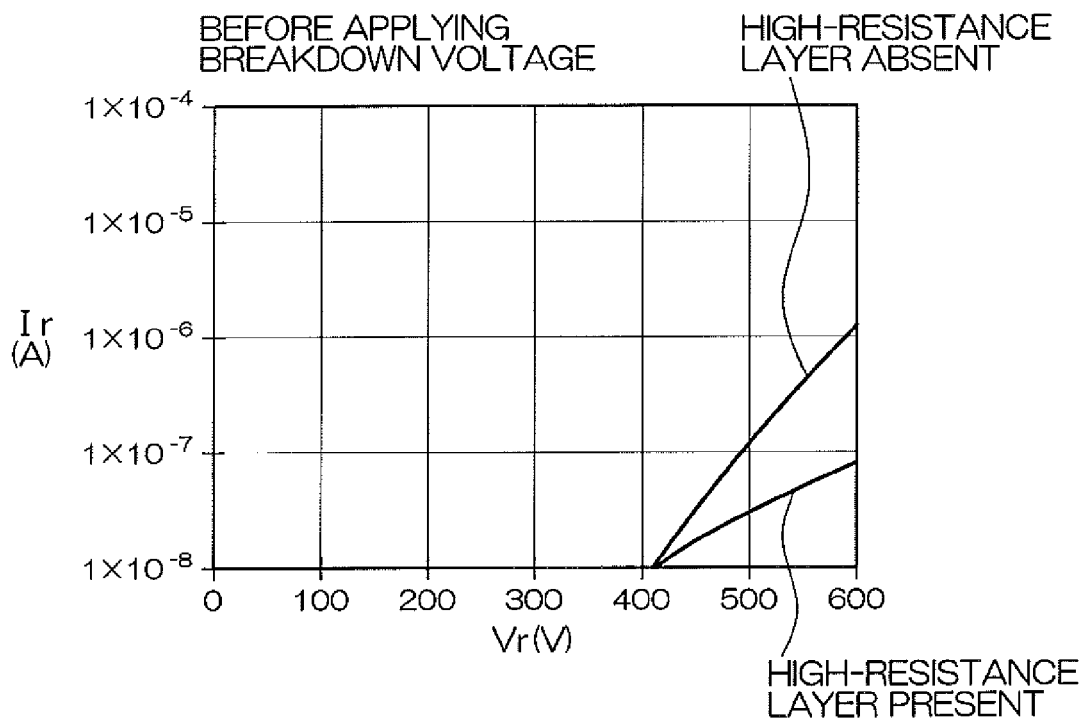
FIG. 9 is a graph showing a relationship (before applying a breakdown voltage) between a reverse leakage current and a voltage to be applied in the Schottky barrier diode.
Figure 10:
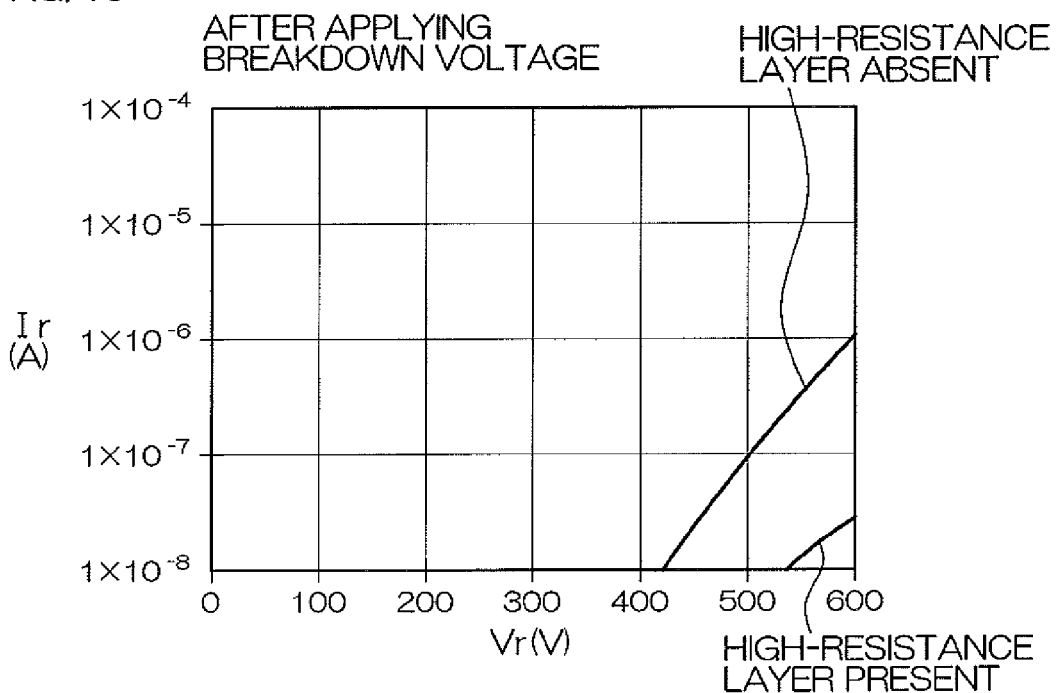
FIG. 10 is a graph showing a relationship (after applying a breakdown voltage) between a reverse leakage current and a voltage to be applied in the Schottky barrier diode.

Thereafter, a prototype of the Schottky barrier diode was actually produced, and the amount of reverse leakage current reduced was analyzed by measuring the reverse leakage current by use of the prototype. The structure of the prototype is shown in FIG. 7 and FIG. 8, and actual measured values of the leakage current are shown in FIG. 9 and FIG. 10. In FIG. 7 and FIG. 8, the same reference sign as in FIG. 2 is given to each component equivalent to each component of FIG. 2.

The prototype of FIG. 7 and that of FIG. 8 were produced as follows.

An n− type epitaxial layer 6 (Concentration=$1 \times 10^{16}$ cm$^{-3}$, Thickness T=3.5 μm) was grown on a n− type substrate 2 (Concentration=$1 \times 10^{19}$ cm$^{-3}$, Thickness=250 μm, Chip size=1.44 mm square). Thereafter, with Implanting energy=180 keV and Dose amount=$1 \times 10^{15}$ cm$^2$, boron (B) ions were implanted from the front surface 12 of the epitaxial layer 6 toward the inside through a hard mask (SiO$_2$) that has undergone patterning so as to have a predetermined shape. Thereafter, the epitaxial layer 6 was heat-treated at 1150° C. for 30 minutes (annealing treatment). As a result, a high-resistance layer 17 (Depth $D_1$=4500 Å, Width $W_1$=1 μm, Pitch P of unit cell=4 μm, only FIG. 8) and a guard ring 26 were simultaneously formed on the surface layer portion of the epitaxial layer 6. Thereafter, a field insulation film 16 (Thickness of SiO$_2$=15000 Å) was formed on the front surface 12 of the epitaxial layer 6, and was subjected to patterning so as to expose an active region 13 having a 1.2 mm square. Thereafter, an anode electrode 19 was formed. The anode electrode 19 had animated structure of Ti/TiN/Al in order from the front surface 12 of the epitaxial layer 6. After forming the anode electrode 19, a cathode electrode 4 in which the layers Ti/Ni/Au/Ag were stacked in order from the rear surface 3 was formed on the rear surface 3 of the substrate 2.

Thereafter, a leakage current flowing when a reverse voltage $V_r$ of 0 V to 600 V was applied to the anode-to-cathode interval of each Schottky barrier diode shown in FIG. 7 and FIG. 8 was measured. Results are shown in FIG. 9.

Thereafter, a reverse breakdown voltage (980 V) was applied for 10 msec. to the anode-to-cathode interval of each Schottky barrier diode shown in FIG. 7 and FIG. 8. Thereafter, in the same way as above, a leakage current flowing when a reverse voltage $V_r$ of 0 V to 600 V was applied to the anode-to-cathode interval of each Schottky barrier diode shown in FIG. 7 and FIG. 8 was measured. Results are shown in FIG. 10.

It has been recognized that, in the Schottky barrier diode that does not have the high-resistance layer 17, a leakage current becomes higher in proportion to an increase in voltage from 400 V to 600 V, and a leakage current of about $1 \times 10^{-6}$ amperes flows at 600 V as shown in FIG. 9. The amount of this leakage current was hardly reduced as shown in FIG. 10 even when a breakdown voltage was applied to the Schottky barrier diode.

On the other hand, in the Schottky barrier diode that has the high-resistance layer 17, a leakage current at about 400 V has substantially the same amount (about $1\times10^{-8}$ amperes) as in the former case ("high-resistance layer 17 absent") as shown in FIG. 9. However, it has been recognized that the increasing rate in a process for raising the voltage from 400 V to 600 V is lower than in the former case. As a result, the leakage current at 600 V was able to be reduced to about $1\times10^{-7}$ amperes. Moreover, in this Schottky barrier diode, the leakage current was able to be greatly reduced by applying a breakdown voltage to the anode-to-cathode interval. For example, it has been recognized that the leakage current at 600 V is reduced to about $0.5\times10^{-7}$ amperes as shown in FIG. 10.

<Surface Flatness and Recognition of Relationship Between Surface Flatness and Leakage Current>

Next, with reference to FIG. 11 to FIG. 13, a description will be given of how the flatness of the front surface 12 of the epitaxial layer 6 varies depending on the temperature of annealing treatment.

First, an n⁻ type epitaxial layer 6 (Concentration=$1\times10^{16}$ cm⁻³, Thickness T=3.5 μm) was grown on an n⁺ type substrate 2 (Concentration=$1\times10^{19}$ cm⁻³, Thickness=250 μm). Without performing annealing treatment from this state, the rugged state of the front surface 12 of the epitaxial layer 6 was measured by an atomic force microscope (AFM). A graph in which a part of an AFM image obtained here has undergone a cross-section analysis is shown in FIG. 11. Likewise, the rugged state of the front surface 12 that underwent annealing treatment for 3 minutes at 1450° C. after the growth of the epitaxial layer 6 was examined, and the rugged state of the front surface 12 that underwent annealing treatment for 3 minutes at 1600° C. was examined. Results are shown in FIG. 12 and FIG. 13, respectively.

As shown in FIG. 11 and FIG. 12, it has been recognized that the flatness of the front surface 12 will be maintained if annealing treatment is not applied to the epitaxial layer 6 or if annealing treatment is applied thereto at a processing temperature of 1450° C. (<1500° C.) (Rugged amplitude of ±1.0 nm or less=Surface roughness Rms of 1 nm or less).

On the other hand, in the epitaxial layer 6 that has undergone annealing treatment at 1600° C. (≥1500° C.), it has been recognized that step bunching occurs in the front surface 12, and hence flatness deteriorates as shown in FIG. 13 (Rugged amplitude of ±3.0 nm or more=Surface roughness Rms of 3 nm or more).

Thereafter, two products obtained by performing annealing treatment for 3 minutes at 1450° C. were used as prototypes, and cleaning treatment was applied to the front surface 12 of the epitaxial layer 6 of each prototype. O₂ plasma treatment was applied to the front surface 12 of the epitaxial layer 6 of one of the two prototypes, whereas a sacrificial oxide film was formed by thermal oxidation on the front surface 12 of the epitaxial layer 6 of the other prototype and was then treated to peel off the sacrificial oxide film. Thereafter, Ti was allowed to make a Schottky junction with the front surface 12 of the epitaxial layer 6 of each prototype (Schottky barrier σBN=1.14 eV), and, as a result, a Schottky barrier diode was produced.

Thereafter, a forward current $I_f$ and a reverse leakage current $I_r$ flowing when a forward voltage $V_f$ and a reverse voltage $V_r$ of 0 V to 600 V were applied to the anode-to-cathode interval of each Schottky barrier diode, respectively, were measured. Results are shown in FIG. 14 and FIG. 15.

Figure 14:
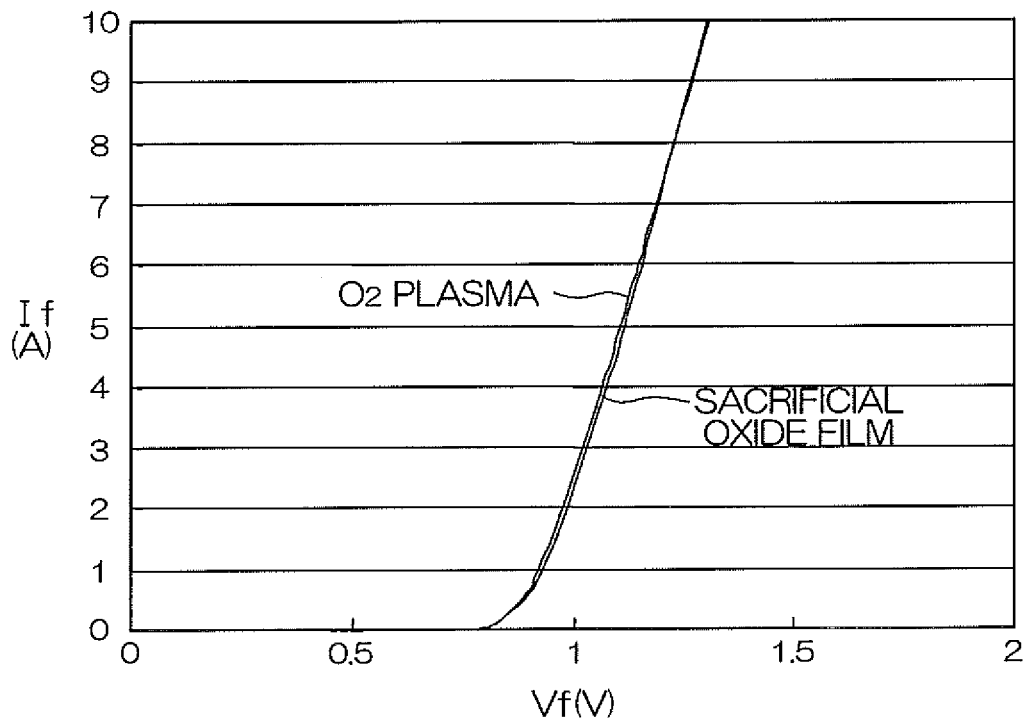
FIG. 14 is a graph showing a relationship between a forward current and a voltage to be applied in the Schottky barrier diode.

As shown in FIG. 14, it has been recognized that there is little difference in forward characteristics between a case in which O₂ plasma treatment is performed and a case in which treatment by the sacrificial oxide film is performed as the cleaning treatment with respect to the front surface 12 of the epitaxial layer 6.

Figure 15:
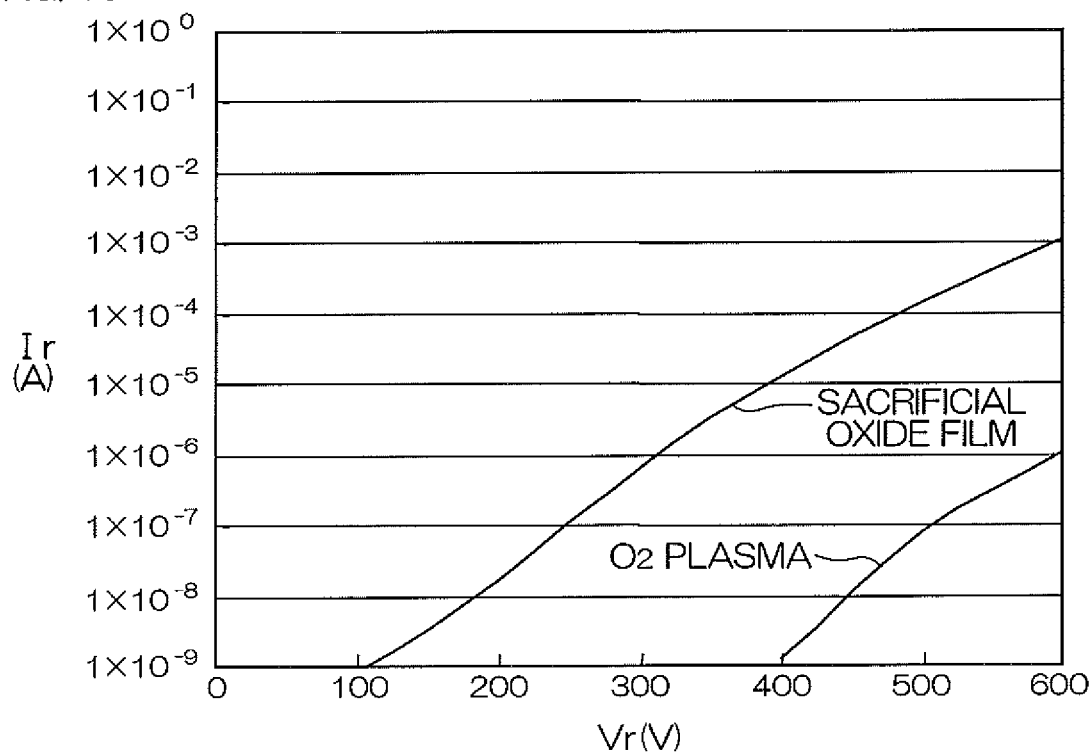
FIG. 15 is a graph showing a relationship between a reverse leakage current and a voltage to be applied in the Schottky barrier diode.

On the other hand, as shown in FIG. 15, in the Schottky barrier diode that has undergone the treatment by the sacrificial oxide film, it has been recognized that the leakage current increases from near 100 V, and flows with an amount of about $1\times10^{-3}$ amperes at 600V. It is conceivable that the reason why this leakage current flows is that, when the treatment by the sacrificial oxide film is performed, pits that match the threading dislocation are formed on the front surface 12 of the epitaxial layer 6, and hence the flatness of the front surface 12 deteriorates.

On the other hand, in the Schottky barrier diode that has undergone the O₂ plasma treatment, it has been recognized that the leakage current increases from near 400 V, and yet its value is about $1.0\times10^{-6}$ amperes, which is very small, at 600 V.

From the results of FIG. 15 and the results of FIG. 9 and FIG. 10, it has been recognized that the leakage current can be made even smaller if the surface flatness is excellently maintained by allowing the O₂ plasma treatment to repair the damage of the front surface 12 of the epitaxial layer 6 resulting from ion implantation when the high-resistance layer 17 is formed, in addition to the introduction of the high-resistance layer 17.

<Two Schottky Electrodes (First Metal and Second Metal)>

Next, with reference to FIG. 16 and FIG. 17, a description will be given of the efficiency improvement of reduction of a reverse leakage current and a forward voltage by providing the two Schottky electrodes (first metal 22 and second metal 23).

Figure 16:
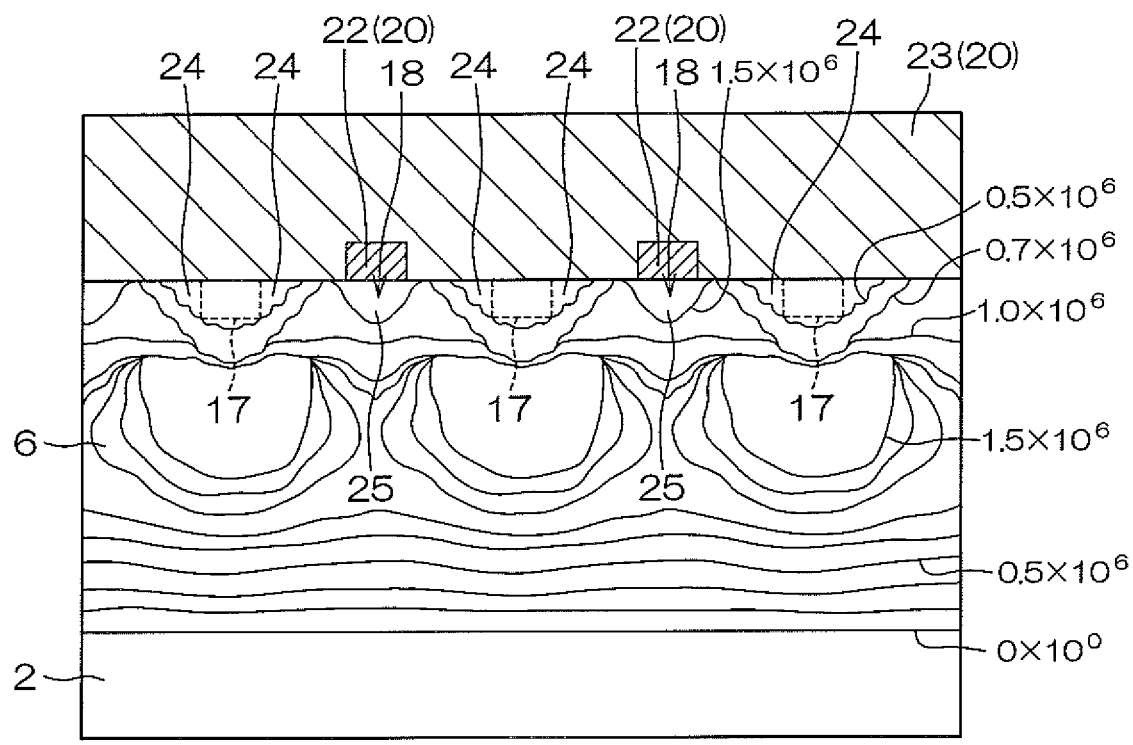
FIG. 16 is an enlarged view of the distribution view of the electric field strength shown in FIG. 6.

FIG. 16 is an enlarged view of the distribution view of electric field strength shown in FIG. 6, enlarging a part near the high-resistance layer of the Schottky barrier diode. FIG. 17 is a graph showing a relationship between each position and electric field strength in the surface of a unit cell of FIG. 16.

As described above, in the Schottky barrier diode 1 of the present preferred embodiment, the electric field strength of the peripheral edge 24 of the unit cell 18 can be weakened by forming the high-resistance layer 17. Therefore, although the electric field strength distributed in the front surface 12 of the unit cell 18 does not cause an increase in the reverse leakage current as an absolute value, there is a case in which a part having relatively high electric field strength and a part having relatively low electric field strength are present as in the relationship between the central part 25 and the peripheral edge 24 of the unit cell 18.

Figure 17:
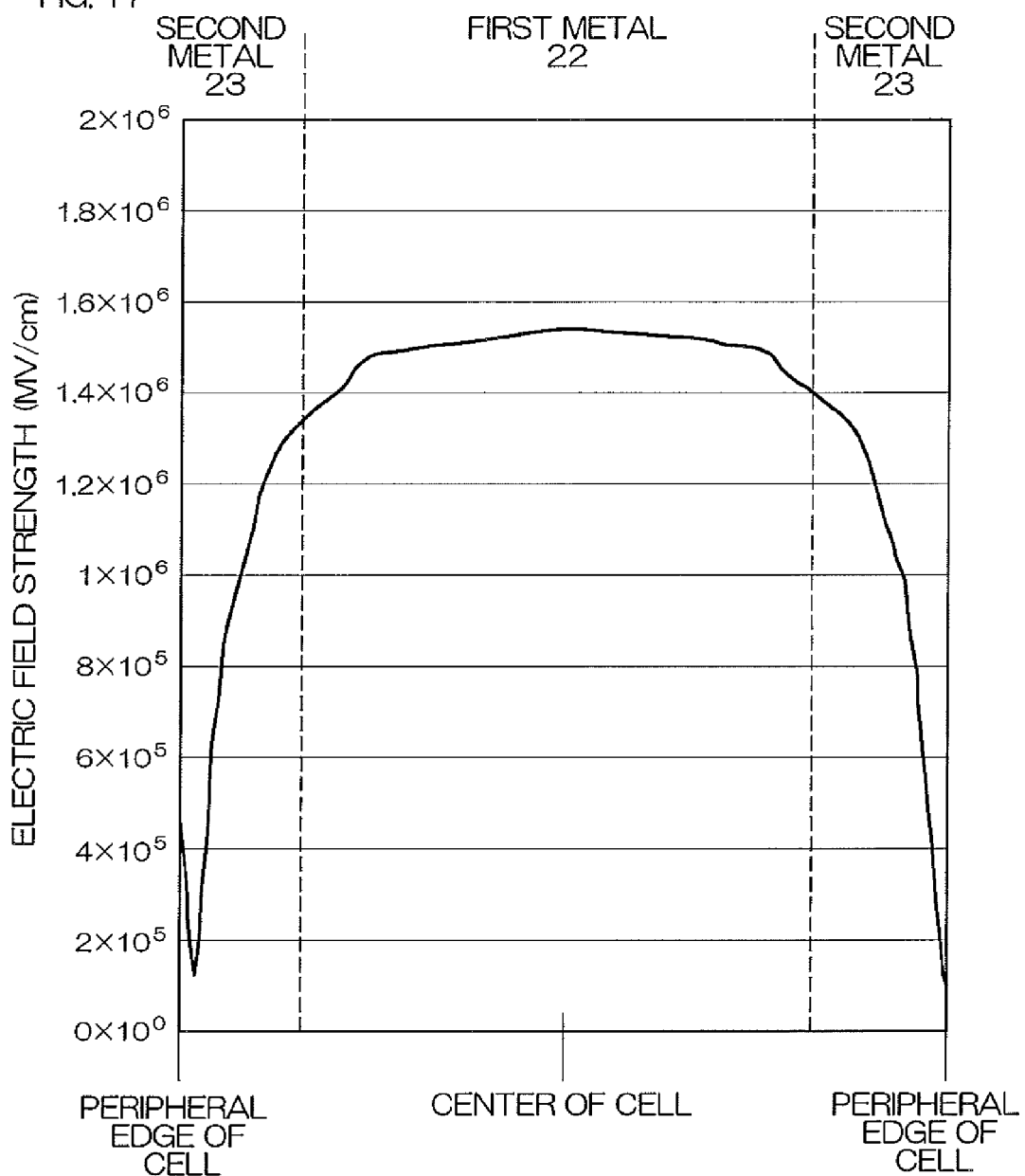
FIG. 17 is a graph showing a relationship between each position and electric field strength in the surface of a unit cell of FIG. 16.

More specifically, as shown in FIG. 16 and FIG. 17, an electric field strength of $0.5\times10^6$ V/cm to $0.7\times10^6$ V/cm is distributed in the peripheral edge 24 of the unit cell 18 that is one example of the first part of the semiconductor layer. On the other hand, an electric field strength of about $1.5\times10^6$ V/cm is distributed in the central part 25 of the unit cell 18 that is one example of the second part of the semiconductor layer. In the electric field strength distribution when a reverse voltage is applied, the electric field strength (the second electric field) of the central part 25 of the unit cell 18 is higher than the electric field strength (the first electric field) of the peripheral edge 24 of the unit cell 18.

Therefore, Ni or the like, which forms a comparatively high potential barrier (for example, 1.4 eV) and which serves as the first metal 22, is allowed to make a Schottky junction with the central part 25 of the unit cell 18 on which a relatively high electric field is exerted. If the electrode is a semiconductor electrode like polysilicon, there will be a case in which a heterojunction between semiconductors mutually different in bandgap is made instead of the Schottky junction.

On the other hand, aluminum (Al) or the like, which forms a comparatively low potential barrier (for example, 0.7 eV) and which serves as the second metal 23, is allowed to make a Schottky junction with the peripheral edge 24 of the unit cell 18 on which a relatively low electric field is exerted.

As a result, in the central part 25 of the unit cell 18 on which a relatively high electric field is exerted when a reverse voltage is applied, a reverse leakage current can be prevented by a high Schottky barrier (second Schottky barrier) between the first metal (Ni) 22 and the epitaxial layer 6.

On the other hand, in the peripheral edge 24 of the unit cell 18 on which a relatively low electric field is exerted, the fear that the reverse leakage current will exceed the Schottky barrier is slight even if the height of the Schottky barrier between the second metal (aluminum) 23 and the epitaxial layer 6 is lowered. Therefore, when a forward voltage is applied, an electric current can be preferentially allowed to flow at a low voltage by making the Schottky barrier (first Schottky barrier) low. Additionally, the second metal 23 can be used also as a contact metal by excluding the contact metal 21.

Therefore, it has been recognized that the reverse leakage current and the forward voltage can be efficiently reduced by properly selecting the anode electrode (Schottky electrode) 19 in accordance with the distribution of the electric field strength of the unit cell 18 when a reverse voltage is applied.

<Impurity Concentration of Epitaxial Layer>

Next, the magnitude of the impurity concentration of the substrate 2 and that of the epitaxial layer 6 will be described with reference to FIG. 18.

Figure 18:
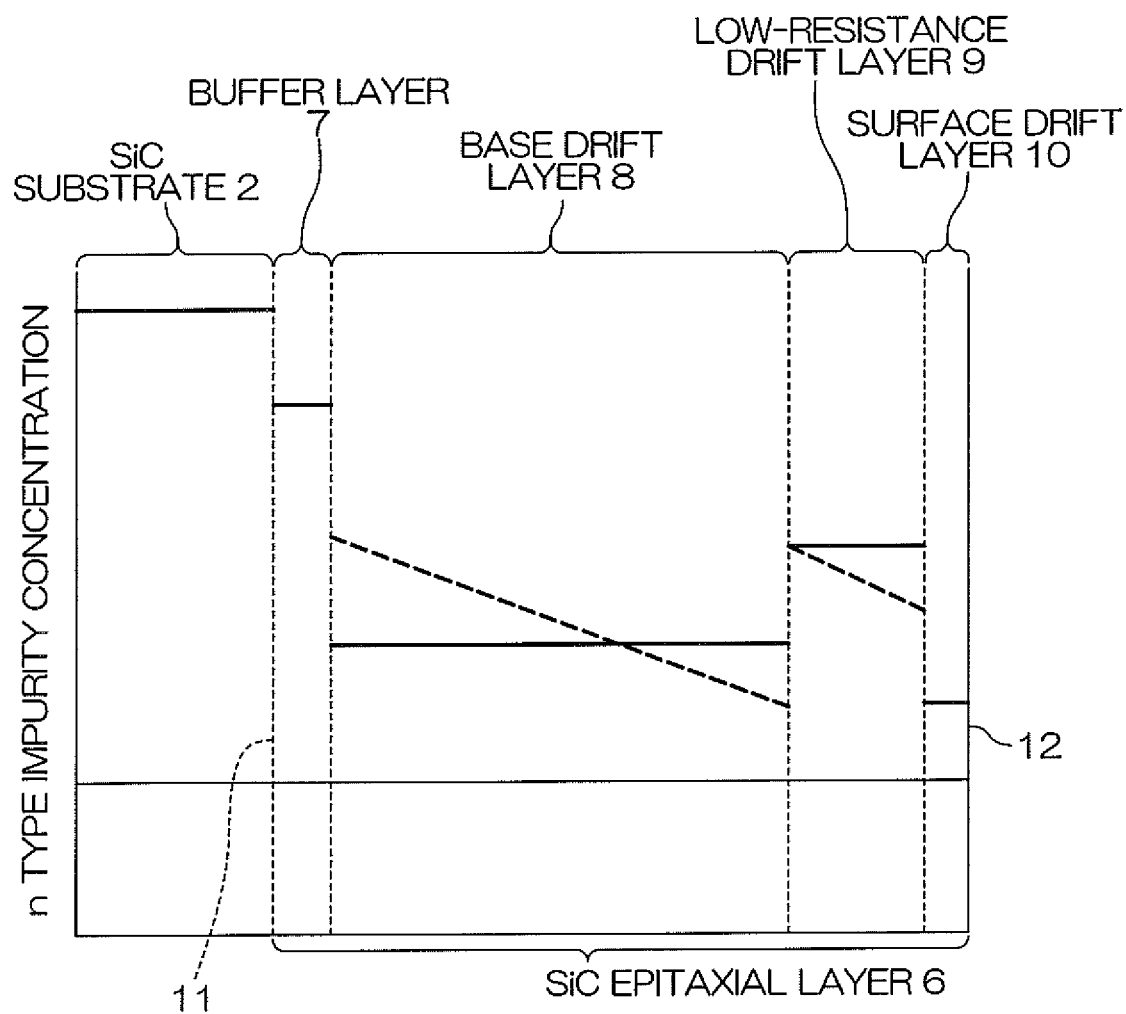
FIG. 18 is a view to describe the impurity concentration of the substrate and that of the epitaxial layer.

FIG. 18 is a view to describe the impurity concentration of the substrate and that of the epitaxial layer.

As shown in FIG. 18, each of the substrate 2 and the epitaxial layer 6 is made of n type SiC that contains n type impurities. The magnitude relationship among the impurity concentrations is Substrate 2>Buffer layer 7>Drift layers 8 to 10.

The concentration of the substrate 2 is constant, for example, at $5 \times 10^{18}$ to $5 \times 10^{19}$ cm$^{-3}$ along its thickness direction. The concentration of the buffer layer 7 is constant, for example, at $1 \times 10^{17}$ to $5 \times 10^{18}$ cm$^{-3}$ along its thickness direction, or is low along its surface.

The concentration of each of the drift layers 8 to 10 varies in a step-by-step manner with interfaces between the base drift layer 8, the low-resistance drift layer 9, and the surface drift layer 10 as boundaries, respectively. In other words, there is a difference in concentration between the layer on the side of the front surface 12 and the layer on the side of the rear surface 11 with respect to each interface.

The concentration of the base drift layer 8 is constant, for example, at $5 \times 10^{14}$ to $5 \times 10^{16}$ cm$^{-3}$ along its thickness direction. The concentration of the base drift layer 8 may become smaller continuously from about $3 \times 10^{16}$ cm$^{-3}$ to about $5 \times 10^{15}$ cm$^{-3}$ in proportion to an approach to the front surface from the rear surface 11 of the epitaxial layer 6 as shown by the broken line of FIG. 18.

The concentration of the low-resistance drift layer 9 is higher than the concentration of the base drift layer 8, and is constant, for example, at $5 \times 10^{15}$ to $5 \times 10^{17}$ cm$^{-3}$ along its thickness direction. The concentration of the low-resistance drift layer 9 may become smaller continuously from about $3 \times 10^{17}$ cm$^{-3}$ to about $1 \times 10^{16}$ cm$^{-3}$ in proportion to an approach to the front surface from the rear surface 11 of the epitaxial layer 6 as shown by the broken line of FIG. 18.

The concentration of the surface drift layer 10 is lower than the concentration of the base drift layer 8 and than the concentration of the low-resistance drift layer 9, and is constant, for example, at $5 \times 10^{14}$ to $1 \times 10^{16}$ cm$^{-3}$ along its thickness direction.

As shown in FIG. 1 and FIG. 2, in the unit cell (line cell) 18 divided by the striped high-resistance layer 17, an area (current path) in which an electric current can be passed is restricted by the width of the pitch P of the high-resistance layer 17. Therefore, there is a fear that the resistance value of the unit cell 18 will rise if the impurity concentration of a part forming the unit cell 18 in the epitaxial layer 6 is low.

Therefore, in the present preferred embodiment, the concentration of the low-resistance drift layer 9 forming the base portion of the unit cell 18 is made higher than that of the base drift layer 8 as shown in FIG. 18. This makes it possible to allow the low-resistance drift layer 9 having a comparatively high concentration to restrain a rise in the resistance value of the unit cell 18 even if the current path is restricted by the pitch width of the high-resistance layer 17. As a result, the resistance of the unit cell 18 can be lowered.

On the other hand, the surface drift layer 10 that has a comparatively low concentration is disposed on the surface layer portion of the unit cell 18 being in contact with the Schottky metal 20. This makes it possible to reduce electric field strength exerted on the front surface 12 of the epitaxial layer 6 when a reverse voltage is applied. As a result, the reverse leakage current can be made even smaller.

<Relationship Between High-Resistance Layer and SiC Crystal Structure>

Next, a relationship between the high-resistance layer and the SiC crystal structure will be described with reference to FIG. 19.

FIG. 19 is a schematic view showing a unit cell having a 4H—SiC crystal structure.

SiC used in the Schottky barrier diode 1 of the present preferred embodiment is 3C—SiC, 4H—SiC, 6H—SiC, or the like, depending on a difference in crystal structure.

Thereamong, the crystal structure of 4H—SiC can be approximated in the hexagonal system, and four carbon atoms are combined with one silicon atom. The four carbon atoms are positioned at four vertexes of a regular tetrahedron in which a silicon atom is placed at the center. In these four carbon atoms, one silicon atom is positioned in the direction of the [001] axis with respect to a carbon atom, and the other three carbon atoms are positioned on the [000-1] axis side with respect to silicon-atom-group atoms.

The [0001] axis and the [000-1] axis are along the axial direction of a hexagonal column, and the plane (top surface of the hexagonal column) that defines this [0001] axis as a normal is a (0001) plane (Si plane). On the other hand, the plane (lower surface of the hexagonal column) that defines the [000-1] axis as a normal is a (000-1) plane (C plane).

Each of the side surfaces of the hexagonal column that defines the [1-100] axis as a normal is a (1-100) plane, and the plane that passes through a pair of ridge lines not adjacent to each other and that defines the [11-20] axis as a normal is a (11-20) plane. These are crystal planes perpendicular to the (0001) plane and to the (000-1) plane.

In the present preferred embodiment, the substrate 2 that defines the (0001) plane as a principal plane is used, and, in addition, the epitaxial layer 6 is grown so that the (0001) plane serves as a principal plane. The high-resistance layer 17 is formed on the surface layer portion of the (0001) plane.

<Production Method of Schottky Barrier Diode>

Next, a method for producing the Schottky barrier diode of FIG. 2 will be described with reference to FIG. 20A to FIG. 20H.

Figure 20A:
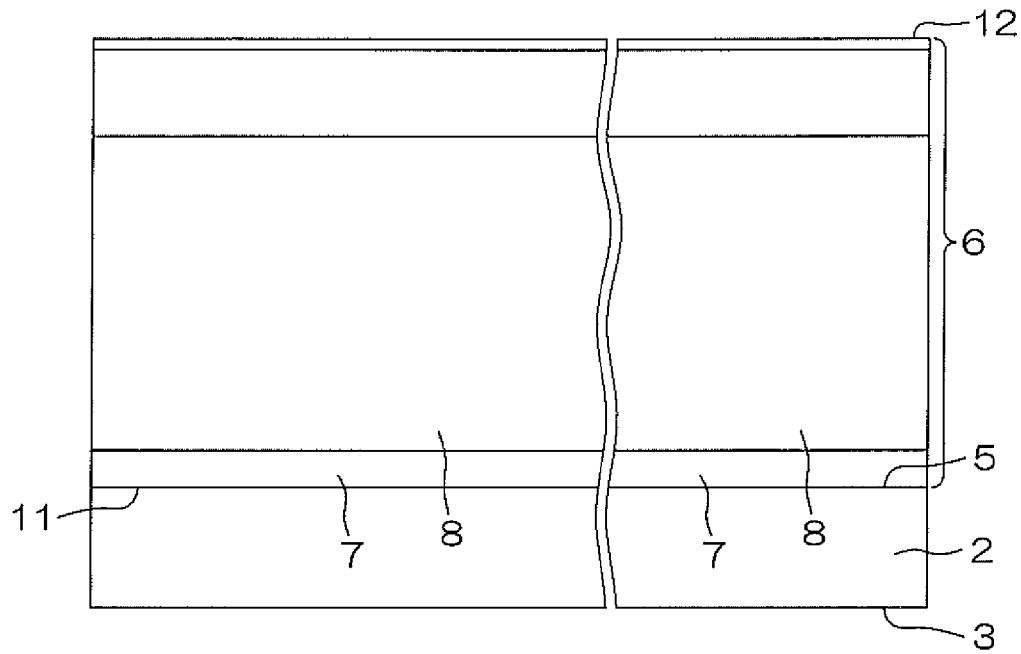
FIG. 20A is a view showing apart of a process for producing the Schottky barrier diode of FIG. 2.

First, as shown in FIG. 20A, the buffer layer 7, the base drift layer 8, the low-resistance drift layer 9, and the surface drift layer 10 are epitaxially grown in this order on the substrate 2.

Figure 20B:
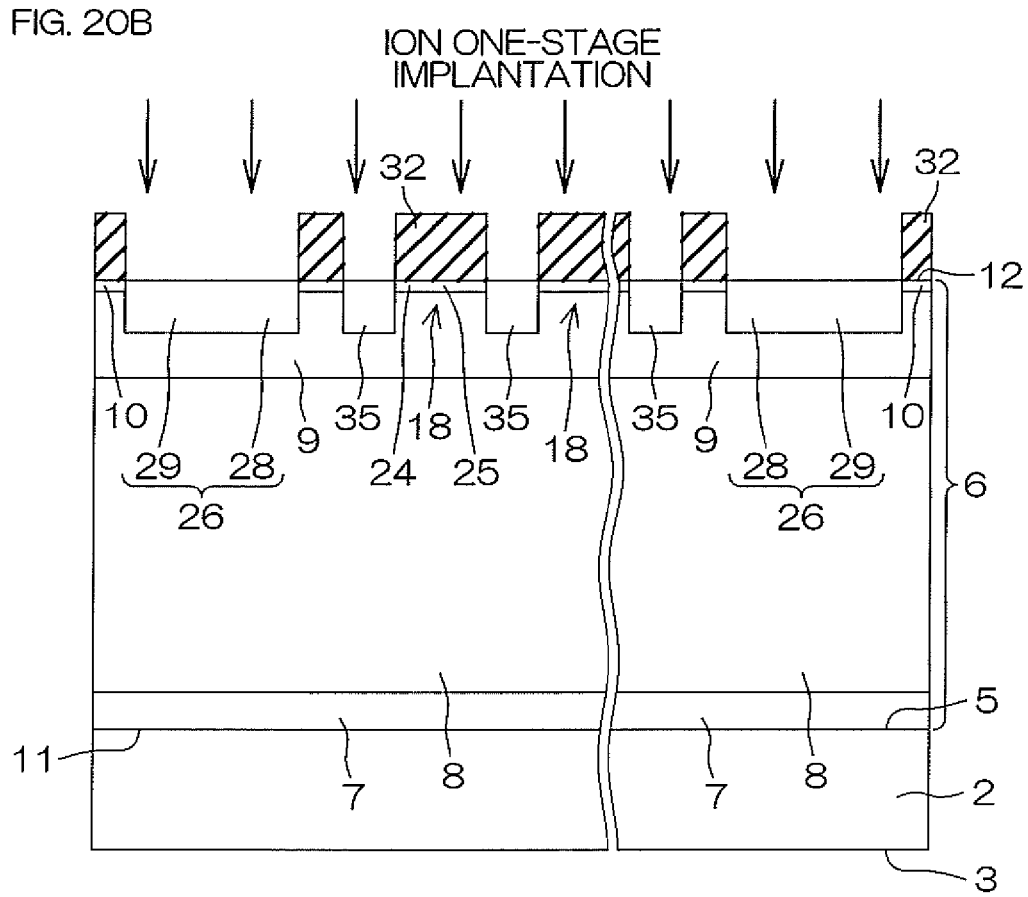
FIG. 20B is a view showing a step subsequent to the step of FIG. 20A.

Thereafter, as shown in FIG. 20B, a hard mask 32 made of $SiO_2$ is formed on the front surface 12 ((0001) Si plane) of the epitaxial layer 6, for example, according to a CVD (Chemical Vapor Deposition) method. Preferably, the thickness of the hard mask 32 is 1.5 μm to 3 μm. Thereafter, the hard mask 32 is subjected to patterning according to a well-known photolithography technique and a well-known etching technique. Thereafter, impurities (boron ions) are selectively implanted (one-stage implantation) to the position of a depth $D_1$ of 1.1 μm from the front surface 12 at the implanting energy falling within the range of 30 keV to 800 keV toward the front surface 12 of the epitaxial layer 6 through the hard mask 32. The dose amount of the impurities is $1 \times 10^{14}$ $cm^{-2}$ or more. As a result, a highly-concentrated impurity layer 35 to which boron ions have been selectively implanted at a high concentration is formed on the surface layer portion of the epitaxial layer 6. A photoresist, instead of the hard mask 32, may be used as a mask with which the front surface 12 is covered when ion implantation is performed.

Figure 20C:
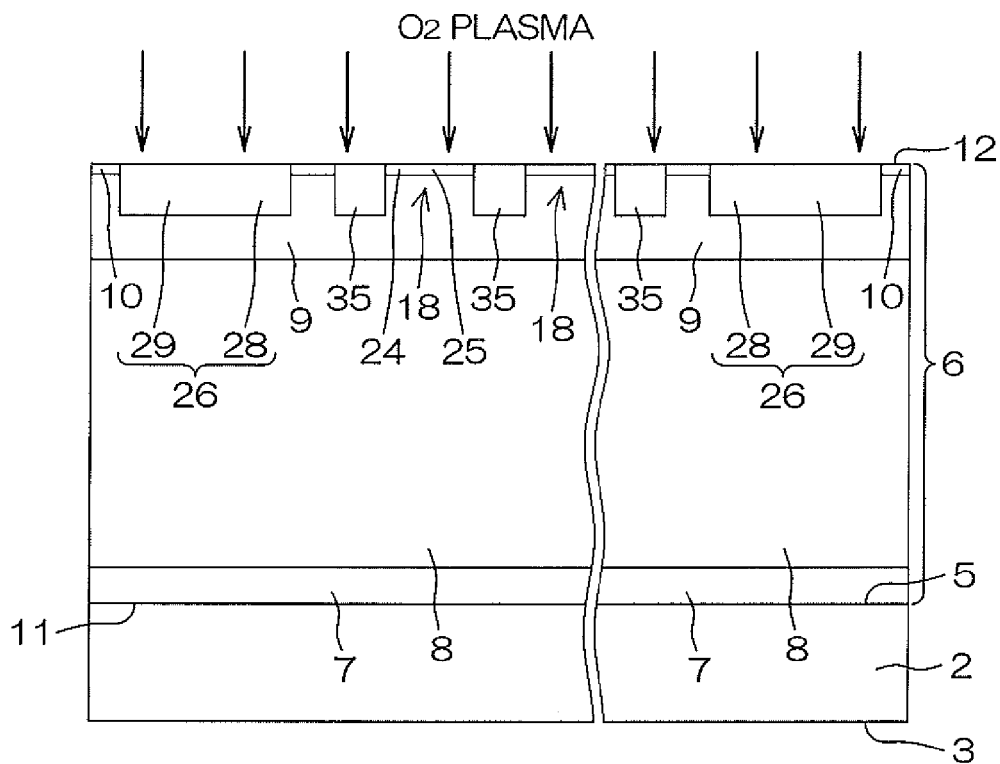
FIG. 20C is a view showing a step subsequent to that of FIG. 20B.

Thereafter, as shown in FIG. 20C, the front surface 12 undergoes $O_2$ plasma treatment such that the hard mask 32 is peeled off, and the epitaxial layer 6 is exposed to $O_2$ plasma. As a result, the front surface 12 that has been damaged during ion implantation to form the highly-concentrated impurity layer 35 undergoes cleaning treatment (first cleaning treatment).

Figure 20D:
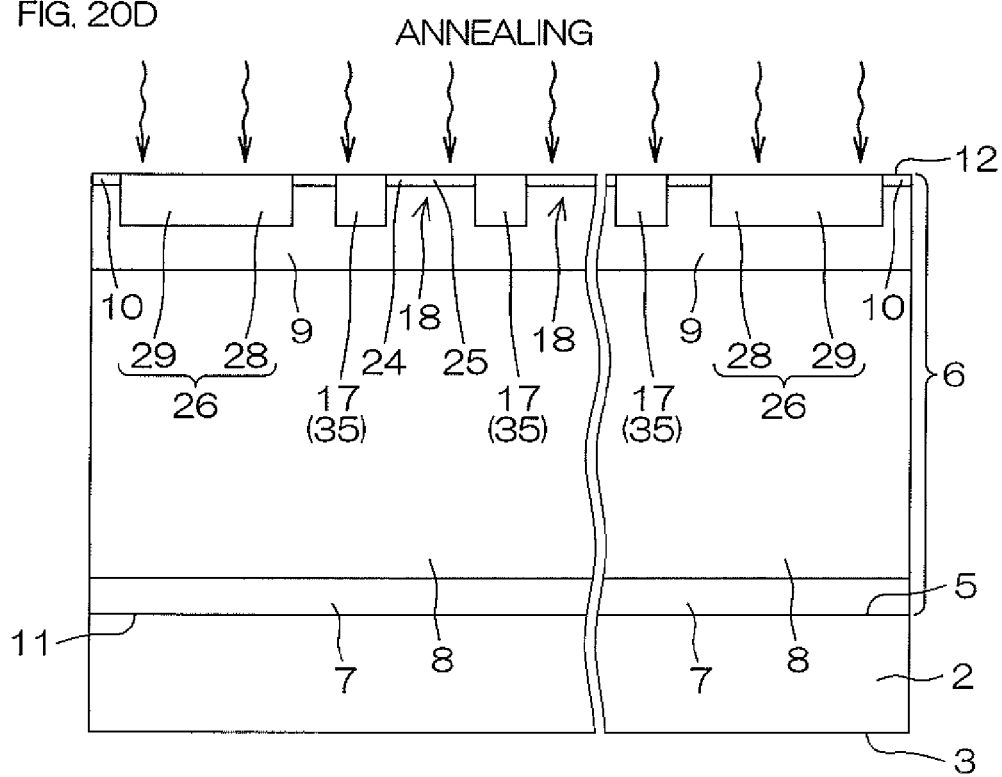
FIG. 20D is a view showing a step subsequent to that of FIG. 20C.

Thereafter, as shown in FIG. 20D, the epitaxial layer 6 undergoes annealing treatment at a temperature less than 1500° C. and, preferably, at a temperature of 1100° C. to 1400° C. As a result, the highly-concentrated impurity layer 35 is converted into a high-resistance layer 17, thus making a stripe-like high-resistance layer 17. In this ion implantation method using boron ions, the boron ion is a comparatively light ion, and therefore it is possible to easily implant these ions from the front surface 12 to a deep position. Therefore, it is possible to easily control the depth $D_1$ of the high-resistance layer 17 within a wide range from a shallow position to a deep position with respect to the front surface 12 of the epitaxial layer 6.

Figure 20E:
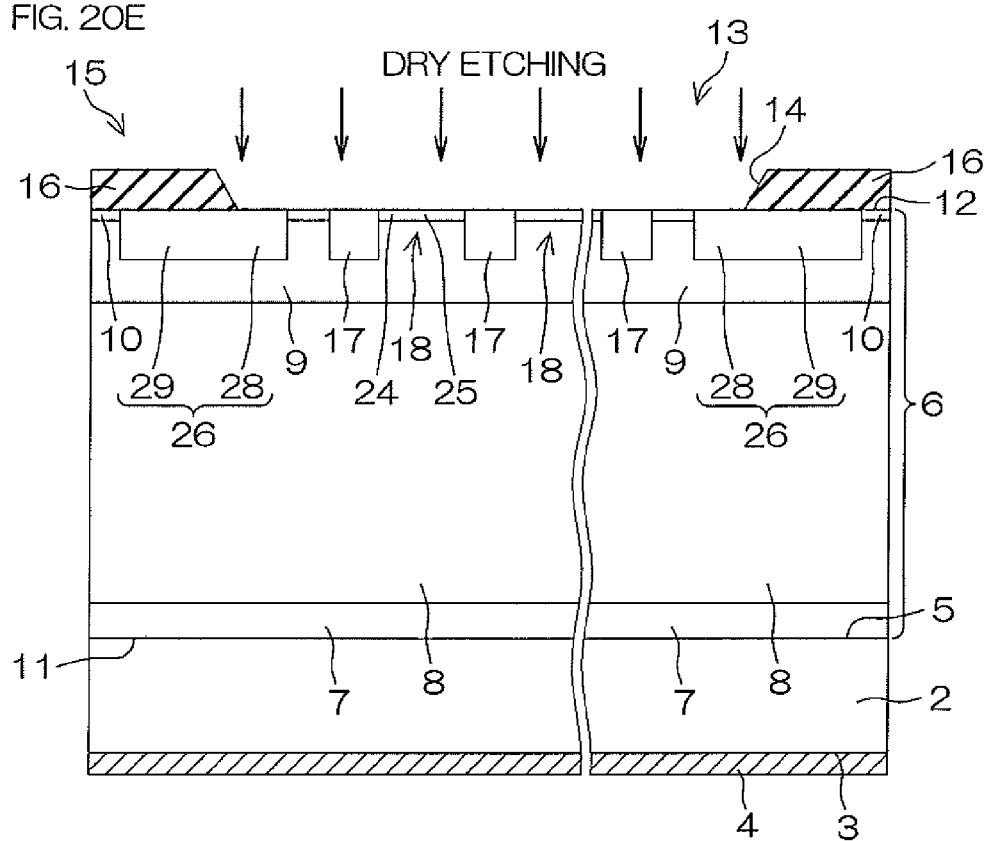
FIG. 20E is a view showing a step subsequent to that of FIG. 20D.

Thereafter, as shown in FIG. 20E, a field insulation film 16 made of $SiO_2$ is formed on the front surface 12 of the epitaxial layer 6, for example, according to the CVD method. Thereafter, the field insulation film 16 selectively undergoes dry etching, and, as a result, a contact hole 14 that selectively exposes the front surface 12 of the epitaxial layer 6 is formed.

Figure 20F:
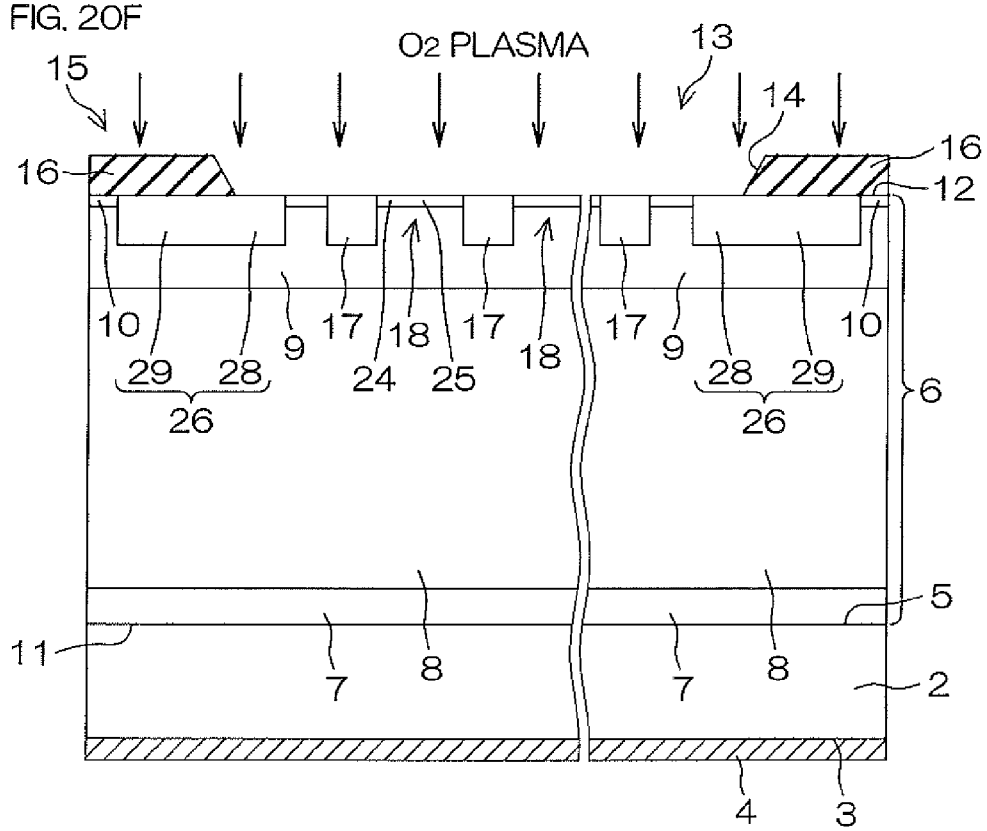
FIG. 20F is a view showing a step subsequent to that of FIG. 20E.

Thereafter, as shown in FIG. 20F, the front surface 12 exposed to the contact hole 14 undergoes $O_2$ plasma treatment while exposing the epitaxial layer 6 to $O_2$ plasma. As a result, the front surface 12 that has been damaged during dry etching to form the contact hole 14 undergoes cleaning treatment (second cleaning treatment).

Figure 20G:
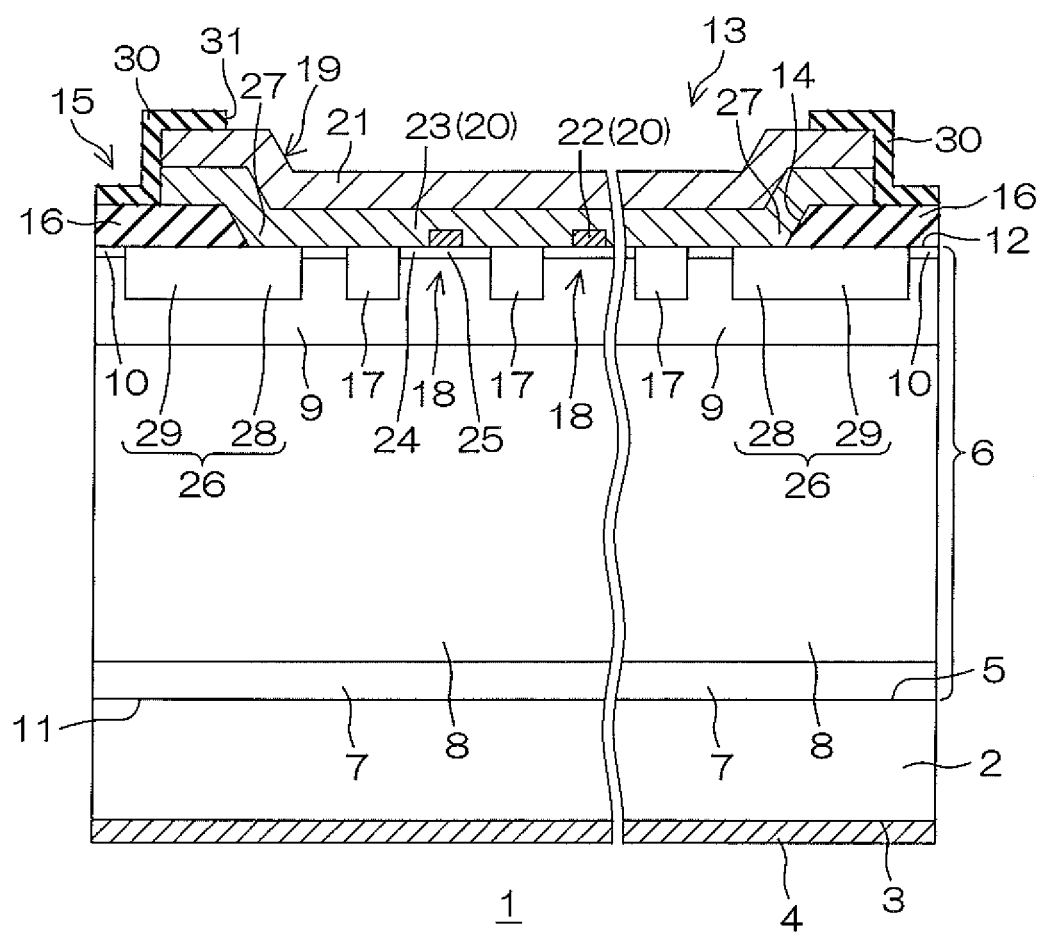
FIG. 20G is a view showing a step subsequent to that of FIG. 20F.
Figure 20H:
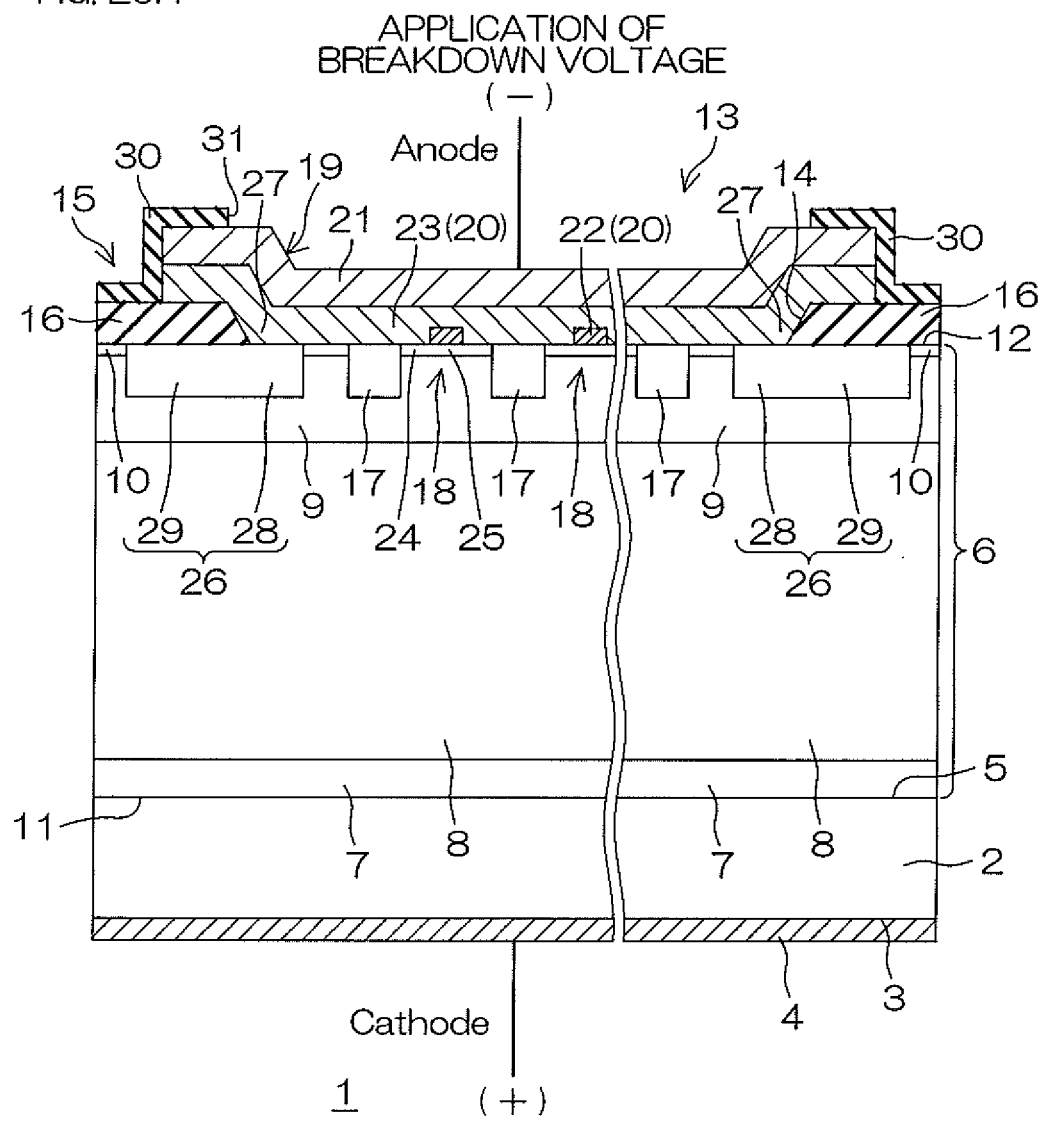
FIG. 20H is a view showing a step subsequent to that of FIG. 20G.

Thereafter, as shown in FIG. 20G, an anode electrode 19 is formed so as to come into contact with the front surface 12 that has undergone cleaning treatment, and a surface protection film 30, a cathode electrode 4, etc., are formed, and thereafter, as shown in FIG. 20H, a reverse breakdown voltage is applied for 10 msec. between the anode electrode 19 and the cathode electrode 4.

It is possible to obtain the Schottky barrier diode 1 of FIG. 2 through the aforementioned steps.

Although the preferred embodiment of the present invention has been described as above, the present invention can be embodied in other modes.

For example, a device in which the conductivity type of each semiconductor part of the Schottky barrier diode 1 is reversed may be employed. For example, in the Schottky barrier diode 1, the p type part may be an n type one, and the n type part may be a p type one.

Additionally, the epitaxial layer 6 and the high-resistance layer 17 may show mutually different conductivity types, and may show mutually identical conductivity types. Any one of the combinations (epitaxial layer 6: n type, high-resistance layer 17: p type), (epitaxial layer 6: p type, high-resistance layer 17: n type), (both epitaxial layer 6 and high-resistance layer 17: n type), and (both epitaxial layer 6 and high-resistance layer 17: p type) may be employed as a concrete combination.

Additionally, the high-resistance layer 17 may be formed by implanting impurities (boron ions) through a plurality of stages (multistage implantation) from the front surface 12 to a depth $D_1$ of 0.1 μm to 1.2 μm while changing the implanting energy within a range of 30 keV to 1000 keV toward the front surface 12 of the epitaxial layer 6.

Additionally, in the aforementioned production method, both of or one of the steps of exposing the epitaxial layer 6 to $O_2$ plasma shown in FIG. 20C and FIG. 20F may be excluded.

Additionally, the epitaxial layer 6 is not limited to a SiC-made layer, and may be a wide bandgap semiconductor other than SiC, such as a semiconductor having an insulation breakdown electric field greater than 1 MV/cm, and, more specifically, may be GaN (whose insulation breakdown electric field is about 3 MV/cm and whose bandgap width is about 3.42 eV) or may be diamond (whose insulation breakdown electric field is about 8 MV/cm and whose bandgap width is about 5.47 eV).

Figure 21:
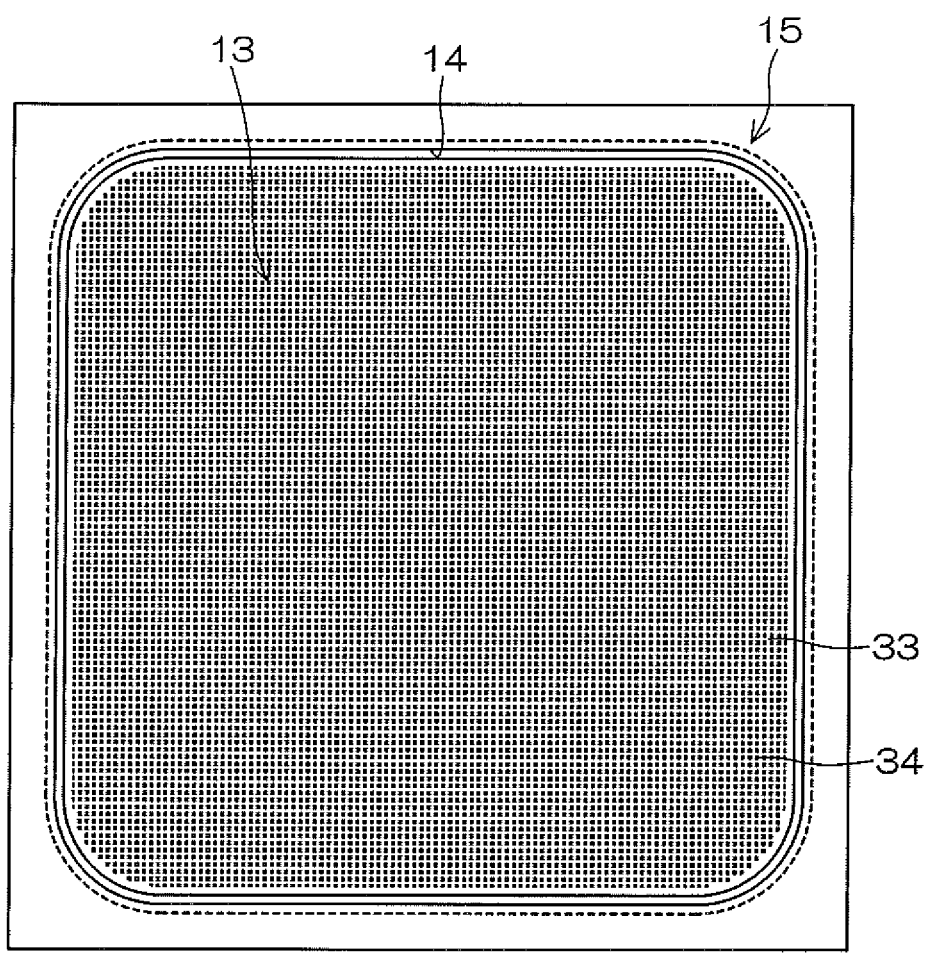
FIG. 21 is a view showing a modification of the planar shape of the high-resistance layer.

Additionally, the planar shape of the high-resistance layer is not necessarily required to be a stripe-like shape, and, it may be a grid-like high-resistance layer 33 shown in, for example, FIG. 21, and may be used together with the stripe-like high-resistance layer 17. If a high-resistance layer 33 is formed, a unit cell 34 will be formed in a rectangular parallelepiped shape at each window part of the grid-like high-resistance layer 33.

Additionally, for example, polysilicon, molybdenum (Mo), titanium (Ti), etc., can be used as the Schottky metal in addition to titanium (Ti), Ni (nickel), and aluminum mentioned above, and can be allowed to make a Schottky junction (heterojunction) with the epitaxial layer 6. For example, polysilicon, instead of Ti, can be used as the Schottky metal of the Schottky barrier diode for measurement that is shown in FIG. 14 and FIG. 15. Additionally, a p type polysilicon, instead of Ni, can be used as the first metal 22 of the Schottky barrier diode for measurement that is shown in FIG. 16 and FIG. 17.

The semiconductor device (semiconductor power device) of the present invention can be built into a power module that is used in an inverter circuit forming a driving circuit to drive an electric motor used as a power source for use in, for example, electric vehicles (including hybrid vehicles), trains, or industrial robots. Additionally, the semiconductor device of the present invention can be built into a power module that is used in an inverter circuit in which electric power generated by solar batteries, wind generators, or other power generators (particularly, private electric generators) is converted so as to match electric power of a commercial power source.

The preferred embodiments of the present invention are merely specific examples used to clarify the technical contents of the present invention, and the present invention should not be understood as being limited to these examples, and the spirit and scope of the present invention are to be determined solely by the appended claims.

Additionally, the components shown in the preferred embodiments of the present invention can be combined together within the scope of the present invention.

The present application corresponds to Japanese Patent Application No. 2011-111129 filed in the Japan Patent Office on May 18, 2011 and to Japanese Patent Application No. 2011-138400 filed in the Japan Patent Office on Jun. 22, 2011, and the entire disclosure of the application is incorporated herein by reference.

REFERENCE SIGNS LIST

1 Schottky barrier diode
2 Substrate
6 Epitaxial layer
7 Buffer layer
8 Base drift layer
9 Low-resistance drift layer
10 Surface drift layer
11 Rear surface (of epitaxial layer)
12 Front surface (of epitaxial layer)
14 Contact hole
16 Field insulation film
17 High-resistance layer
18 Unit cell
19 Anode electrode
20 Schottky metal
22 First metal
23 Second metal
24 Peripheral edge (of unit cell)
25 Central part (of unit cell)
33 High-resistance layer
34 Unit cell
35 Highly-concentrated impurity layer

The invention claimed is:

1. A semiconductor device comprising:
a semiconductor layer made of a wide bandgap semiconductor; and
a Schottky electrode being in contact with a front surface of the semiconductor layer,
the semiconductor layer including:
a drift layer that forms the front surface of the semiconductor layer; and
a high-resistance layer that is formed on a surface layer portion of the drift layer and that has resistance higher than the drift layer,
the high-resistance layer being formed by implanting impurity ions from the front surface of the semiconductor layer and then performing annealing treatment at less than 1500° C., wherein the drift layer has a first part of a first conductivity type on which a first electric field is exerted when a reverse voltage is applied and a second part of the first conductivity type on which a second electric field relatively higher than the first electric field is exerted, and the Schottky electrode includes a first electrode that forms a first Schottky barrier between the first part and the first electrode and a second electrode that forms a second Schottky barrier relatively higher than the first Schottky barrier between the second part and the second electrode.

2. The semiconductor device according to claim 1, the semiconductor device being obtained by applying a voltage greater than a reverse breakdown voltage between the semiconductor layer and the Schottky electrode after applying annealing treatment onto the high-resistance layer.

3. The semiconductor device according to claim 1, wherein the semiconductor layer is made of SiC, and has the front surface consisting of a Si plane, and
pits that match a dislocation defect are not formed on the front surface consisting of the Si plane of the semiconductor layer.

4. The semiconductor device according to claim 1, wherein surface roughness Rms of a junction interface of the front surface of the semiconductor layer making a junction with the Schottky electrode is 1 nm or less.

5. The semiconductor device according to claim 1, wherein an off-angle of the semiconductor layer is 4° or less.

6. The semiconductor device according to claim 1, wherein an activation rate of impurities of the high-resistance layer is less than 5%.

7. The semiconductor device according to claim 1, wherein sheet resistance of the high-resistance layer is 1MΩ/□ or more.

8. The semiconductor device according to claim 1, wherein the first part of the drift layer is formed at a peripheral edge of the high-resistance layer in the surface layer portion of the drift layer, whereas the second part of the drift layer is formed at a part adjacent to the peripheral edge in the surface layer portion of the drift layer.

9. The semiconductor device according to claim 1, wherein the drift layer includes a base drift layer having a first impurity concentration and a low-resistance drift layer that is formed on the base drift layer and that has a second impurity concentration relatively higher than the first impurity concentration, and
the high-resistance layer is formed so as to allow a deepest part of the high-resistance layer to be positioned at a halfway place of the low-resistance drift layer, and divides a part of the semiconductor layer as a unit cell.

10. The semiconductor device according to claim 9, wherein the first impurity concentration of the base drift layer becomes smaller in proportion to an approach to the front surface from a rear surface of the semiconductor layer.

11. The semiconductor device according claim 9, wherein the second impurity concentration of the low-resistance drift layer is constant from the rear surface of the semiconductor layer to the front surface.

12. The semiconductor device according to claim 9, wherein the second impurity concentration of the low-resistance drift layer becomes smaller in proportion to an approach to the front surface from the rear surface of the semiconductor layer.

13. The semiconductor device according to claim 9, wherein the drift layer further includes a surface drift layer, the surface drift layer being formed on the low-resistance drift layer, the surface drift layer having a third impurity concentration relatively lower than the second impurity concentration, the surface drift layer forming the front surface of the semiconductor layer.

14. The semiconductor device according to claim 9, wherein the semiconductor layer further includes a SiC substrate and a buffer layer that is formed on the SiC substrate and that has a fourth impurity concentration relatively higher than the first impurity concentration.

15. The semiconductor device according to claim 1, wherein the high-resistance layer includes a stripe layer formed in a striped shape.

16. The semiconductor device according to claim 1, wherein the high-resistance layer includes a latticed layer formed in a latticed shape.

17. The semiconductor device according to claim 1, wherein the drift layer and the high-resistance layer show mutually different conductivity types.

18. The semiconductor device according to claim 1, wherein the drift layer and the high-resistance layer show mutually identical conductivity types.

19. The semiconductor device according to claim 1, wherein the impurity ions implanted into the semiconductor layer in order to form the high-resistance layer include boron ions.

20. The semiconductor device according to claim 1, wherein an insulation breakdown electric field of the wide bandgap semiconductor is greater than 1 MV/cm.

21. The semiconductor device according to claim 1, wherein the semiconductor layer is made of SiC or GaN or diamond.

\* \* \* \* \*